(12) United States Patent
Choi et al.

(10) Patent No.: US 9,854,701 B2
(45) Date of Patent: Dec. 26, 2017

(54) MULTIVISION DISPLAY SYSTEM

(71) Applicant: SAMSUNG ELECTRONICS CO., LTD., Suwon-si (KR)

(72) Inventors: Dae Su Choi, Suwon-si (KR); Woo Sung In, Hwaseong-si (KR); Jun Ki Noh, Uiwang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 51 days.

(21) Appl. No.: 14/854,796

(22) Filed: Sep. 15, 2015

(65) Prior Publication Data

US 2016/0165745 A1 Jun. 9, 2016

(30) Foreign Application Priority Data

Dec. 1, 2014 (KR) .................. 10-2014-0169541

(51) Int. Cl.
| | | |
|---|---|---|
| *H05K 7/00* | (2006.01) | |
| *H05K 7/18* | (2006.01) | |
| *G06F 3/14* | (2006.01) | |
| *G09F 9/302* | (2006.01) | |
| *F16M 11/04* | (2006.01) | |
| *H01L 27/32* | (2006.01) | |

(52) U.S. Cl.
CPC ............ *H05K 7/18* (2013.01); *F16M 11/043* (2013.01); *G06F 3/1446* (2013.01); *G09F 9/3026* (2013.01); *G09G 2300/026* (2013.01); *H01L 27/3293* (2013.01)

(58) Field of Classification Search
CPC ....................................... G09F 15/02
USPC .................................... 361/679.01
See application file for complete search history.

(56) References Cited

U.S. PATENT DOCUMENTS

| 4,616,940 A * | 10/1986 | DeBruyn ............. A47B 49/006 |
| | | 312/305 |
| 2005/0083275 A1 | 4/2005 | Wang et al. |
| 2008/0263924 A1 | 10/2008 | Nearman et al. |
| 2011/0019348 A1 * | 1/2011 | Kludt ....................... F16B 2/12 |
| | | 361/679.01 |

FOREIGN PATENT DOCUMENTS

| EP | 1995508 A2 | 11/2008 |
| EP | 1995508 A3 | 7/2011 |
| WO | 2011/113145 A1 | 9/2011 |

OTHER PUBLICATIONS

Communication dated Apr. 19, 2016, issued by the European Patent Office in counterpart European Patent Application No. 15183807.5.

* cited by examiner

*Primary Examiner* — Jerry Wu
(74) *Attorney, Agent, or Firm* — Sughrue Mion, PLLC

(57) ABSTRACT

Provided are a multivision display system a stand for the multivision display system. The multivision display system includes: a plurality of displays; and at least one stand configured to support the plurality of displays so as to stand on a horizontal surface, wherein the stand includes: a base configured to be supported by the horizontal surface; and a plurality of coupling frames configured to support the plurality of displays and which are mutually coupled to each other to adjust relative positions of the plurality of displays.

6 Claims, 26 Drawing Sheets

MULTIVISION DISPLAY SYSTEM

CROSS-REFERENCE TO RELATED APPLICATION

This application claims priority from Korean Patent Application No. 10-2014-0169541, filed on Dec. 1, 2014 in the Korean Intellectual Property Office, the disclosure of which is incorporated herein by reference in its entirety.

BACKGROUND

1. Field

Apparatuses and methods consistent with exemplary embodiments relate to a multivision display system including a plurality of displays.

2. Description of the Related Art

Multivision display systems are systems for providing one screen using a plurality of displays.

In general, multivision display systems each include a plurality of displays installed vertically and horizontally adjacent to each other and allow each of the plurality of displays to display a part of the whole screen to be displayed.

Multivision display systems may be formed by fixedly installing displays on the wall using wall mounts fixed to the wall or may be formed by stands which support the plurality of displays.

SUMMARY

Aspects of one or more exemplary embodiments provide a multivision display system able to be more easily formed.

Aspects of one or more exemplary embodiments also provide a multivision display system in which it is possible to easily dispose vertical, horizontal, front, and rear positions of displays disposed vertically and horizontally adjacent to each other.

Additional aspects will be set forth in part in the description which follows and, in part, will be obvious from the description, or may be learned by practice of exemplary embodiments.

According to an aspect of an exemplary embodiment, there is provided a multivision display system including: a plurality of displays; and at least one stand configured to support the plurality of displays so as to stand on a horizontal surface, wherein the stand includes: a base configured to be supported by the horizontal surface; and a plurality of coupling frames configured to support the plurality of displays and which are mutually coupled to each other to adjust relative positions of the plurality of displays.

The plurality of coupling frames may each have a bar shape and may be respectively coupled with a rear surface of each of the plurality of displays.

The plurality of coupling frames may respectively be on both sides of the plurality of displays.

The plurality of coupling frames may each include: a coupling portion extending from one end of the coupling frame; and a coupling groove provided on another end of the coupling frame and coupled with a coupling portion of an adjacent coupling frame.

The system may further include a position adjuster configured to adjust a position of the coupling portion coupled inside the coupling groove.

The coupling groove may have a larger width than the coupling portion to allow the coupling portion of the adjacent coupling frame inserted into the coupling groove to move left and right inside the coupling groove; and the position adjuster may include a left and right adjusting screw in the coupling frame and configured to move the coupling portion coupled inside the coupling groove left and right.

The position adjuster may include: an elevating guide configured to move inside the coupling groove, and a top and bottom adjusting screw in the coupling frame and configured to move the elevating guide left and right; and a bottom surface of the coupling portion and a top surface of the elevating guide may be formed with corresponding inclined surfaces.

The system may further include a first roller rotatably provided on the bottom surface of the coupling portion and a second roller rotatably provided on a bottom of the elevating guide.

The system may further include: a pair of clamps on two adjacent coupling frames, among the plurality of coupling frames, that are on two adjacent displays, among the plurality of displays; and a coupling member configured to fix the pair of clamps to each other.

The system may further include a spacer disposed between side surfaces of two adjacent displays, among the plurality of displays, to block a gap formed between outer surfaces of the two adjacent displays.

The plurality of displays may each include an accommodating groove provided concavely on a side surface thereof and configured to accommodate at least a part of the spacer.

The spacer may include an elastic-deformable material and may be thicker than a depth of the accommodating groove.

According to an aspect of another exemplary embodiment, there is provided a multivision display system including: a plurality of displays; and a plurality of wall mounts configured to support the plurality of displays, while installed on a wall, and to support horizontal movement of the plurality of displays.

Each of the plurality of wall mounts may include a guide rail extending horizontally; and each of the plurality of displays may include a pair of engaging members fixed to a rear surface of the corresponding display and movably engaged in the guide rail.

Each of the pair of engaging members may include an engaging portion engaged in the guide rail; and each of the plurality of wall mounts may include a rotatable elevating screw, a bottom of which passes through the engaging portion and is supported by the guide rail.

The system may further include a cap installed on the bottom of the rotatable elevating screw.

The guide rail may be configured to be movable forward and backward relative to the wall.

Each of the plurality of wall mounts may include: a pair of forward and backward adjusting screws provided on both sides of the guide rail; and a forward and backward adjusting nut configured to rotate while being coupled with the forward and backward adjusting screws and to move the forward and backward adjusting screws forward and backward.

Each of the plurality of wall mounts may include: a fixed bracket configured to be fixed to the wall; a mobile bracket comprising the guide rail and installed on the fixed bracket to be movable forward and backward relative to the wall; and a link assembly which connects the fixed bracket with the mobile bracket and movably supports the mobile bracket.

The system may further include a locking device configured to allow the mobile bracket to be fixed to the fixed bracket.

The locking device may include: a locking member installed on the fixed bracket to be movable vertically, and an elastic member elastically supporting the locking member upward; and wherein the mobile bracket comprises a locking portion configured to lock the locking member.

According to an aspect of another exemplary embodiment, there is provided a stand for a multivision display system, the stand including: a base configured to be supported by a horizontal surface; and a plurality of coupling frames configured to support a plurality of displays and which are mutually coupled to each other to adjust relative positions of the plurality of displays.

The plurality of coupling frames may each have a bar shape and may be configured to be respectively coupled with a rear surface of each of the plurality of displays.

The plurality of coupling frames may each include: a coupling portion extending from one end of the coupling frame; and a coupling groove provided on another end of the coupling frame and coupled with a coupling portion of an adjacent coupling frame.

The stand may further include a position adjuster configured to adjust a position of the coupling portion coupled inside the coupling groove.

The coupling groove may have a larger width than the coupling portion to allow the coupling portion of the adjacent coupling frame inserted into the coupling groove to move left and right inside the coupling groove; and the position adjuster may include a left and right adjusting screw in the coupling frame and configured to move the coupling portion coupled inside the coupling groove left and right.

The position adjuster may include: an elevating guide configured to move inside the coupling groove, and a top and bottom adjusting screw in the coupling frame and configured to move the elevating guide left and right; and a bottom surface of the coupling portion and a top surface of the elevating guide may be formed with corresponding inclined surfaces.

The stand may further include a first roller rotatably provided on the bottom surface of the coupling portion and a second roller rotatably provided on a bottom of the elevating guide.

The stand may further include: a pair of clamps on two adjacent coupling frames, among the plurality of coupling frames; and a coupling member configured to fix the pair of clamps to each other.

BRIEF DESCRIPTION OF THE DRAWINGS

These and/or other aspects will become apparent and more readily appreciated from the following description of exemplary embodiments, taken in conjunction with the accompanying drawings of which.

DETAILED DESCRIPTION

Figure 1:
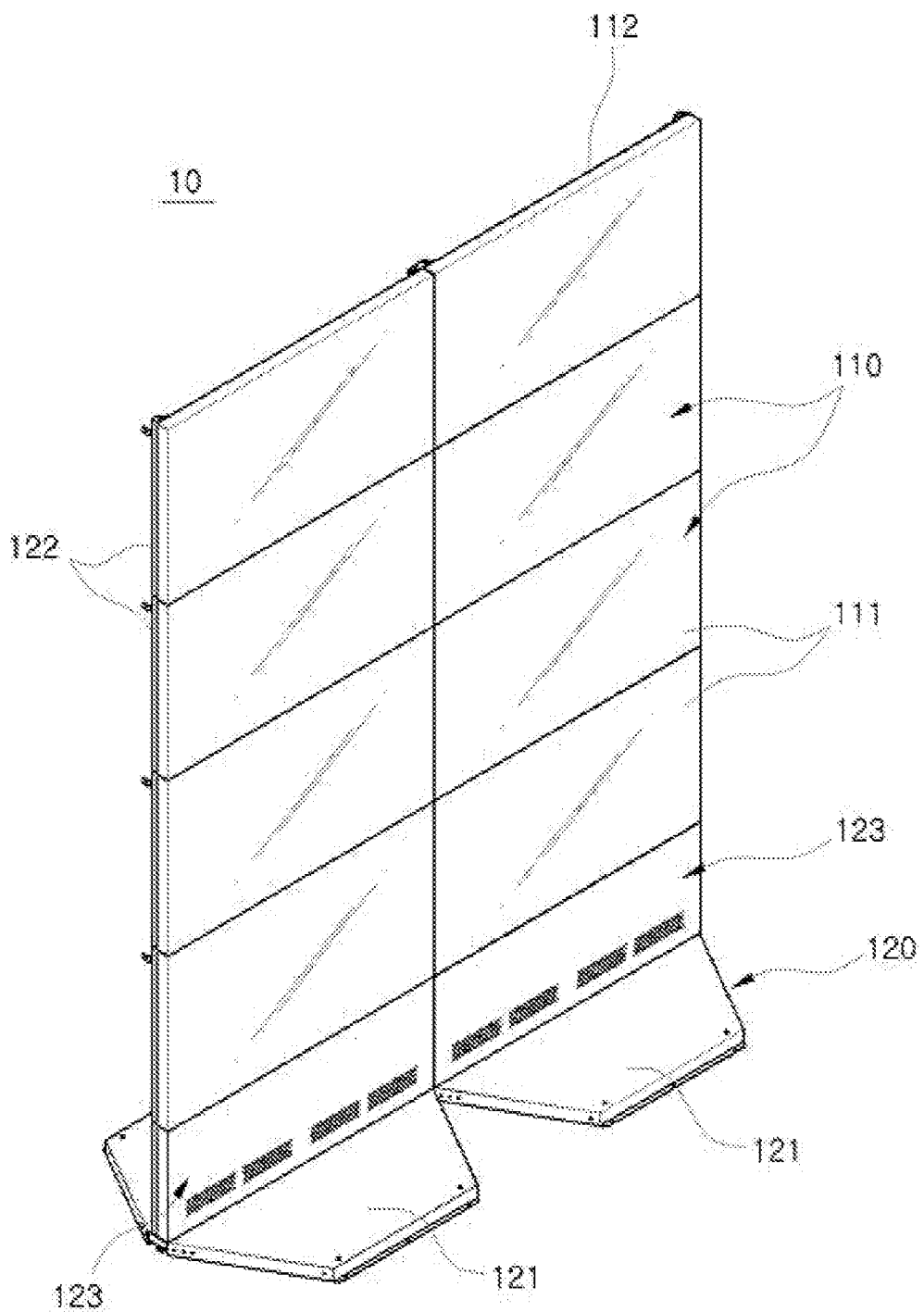
FIG. 1 is a perspective view of a multivision display system according to a first exemplary embodiment.

Reference will now be made in detail to exemplary embodiments, examples of which are illustrated in the accompanying drawings, wherein like reference numerals refer to like elements throughout. Hereinafter, expressions such as "at least one of," when preceding a list of elements, modify the entire list of elements and do not modify the individual elements of the list.

Hereinafter, a plurality of displays 110 according to a first exemplary embodiment will be described with reference to the attached drawings.

Figure 2:
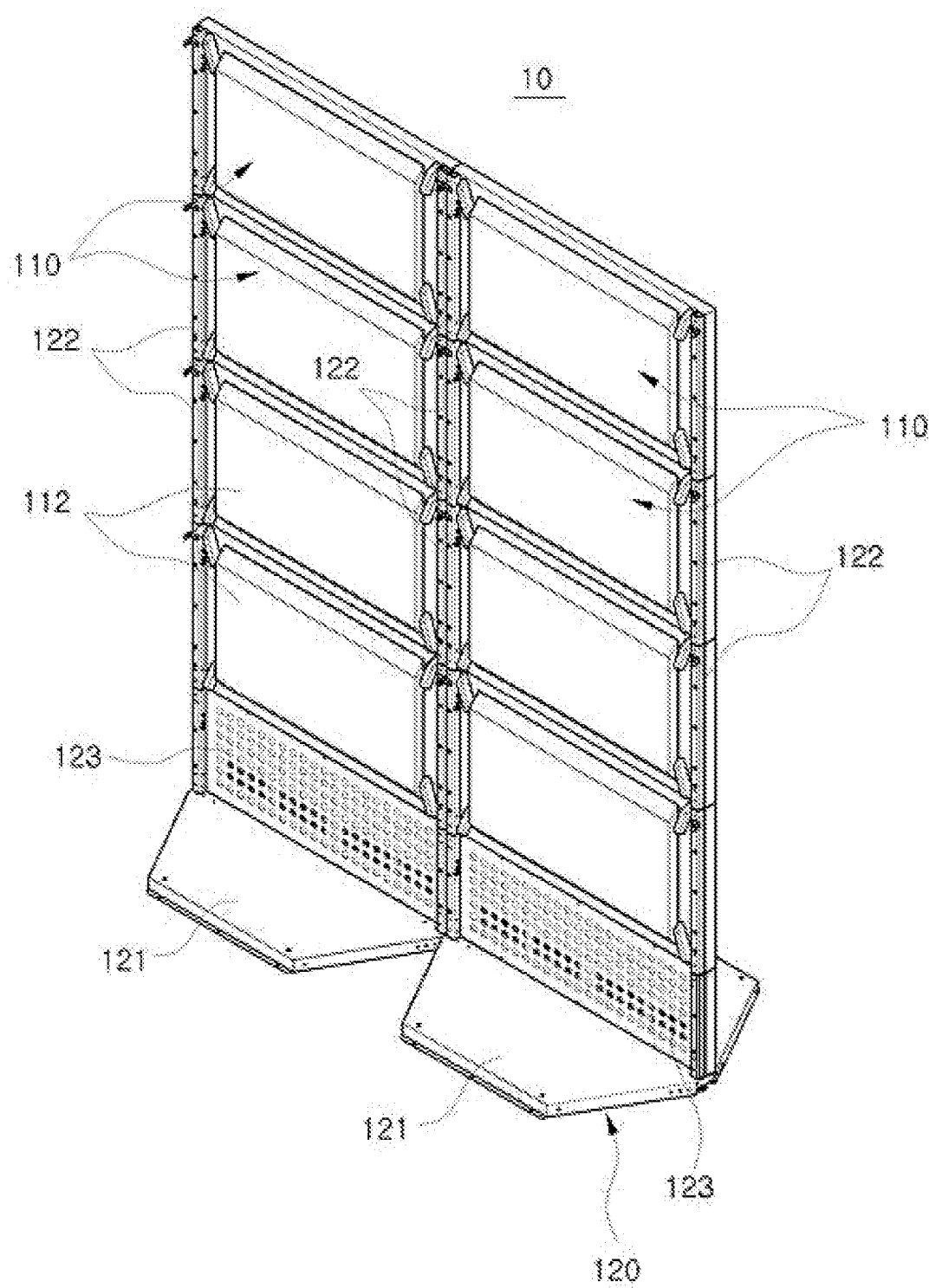
FIG. 2 is a rear perspective view of the multivision display system according to the first exemplary embodiment.

As shown in FIGS. 1 and 2, a multivision display system 10 according to the first exemplary embodiment includes the plurality of displays 110 and a stand 120 that allows or supports the plurality of displays 110 to stand on a horizontal surface.

Each of the plurality of displays 110 includes a display module 111 (e.g., display panel) on which images are displayed and a case 112 that contains the display module 111.

Figure 3:
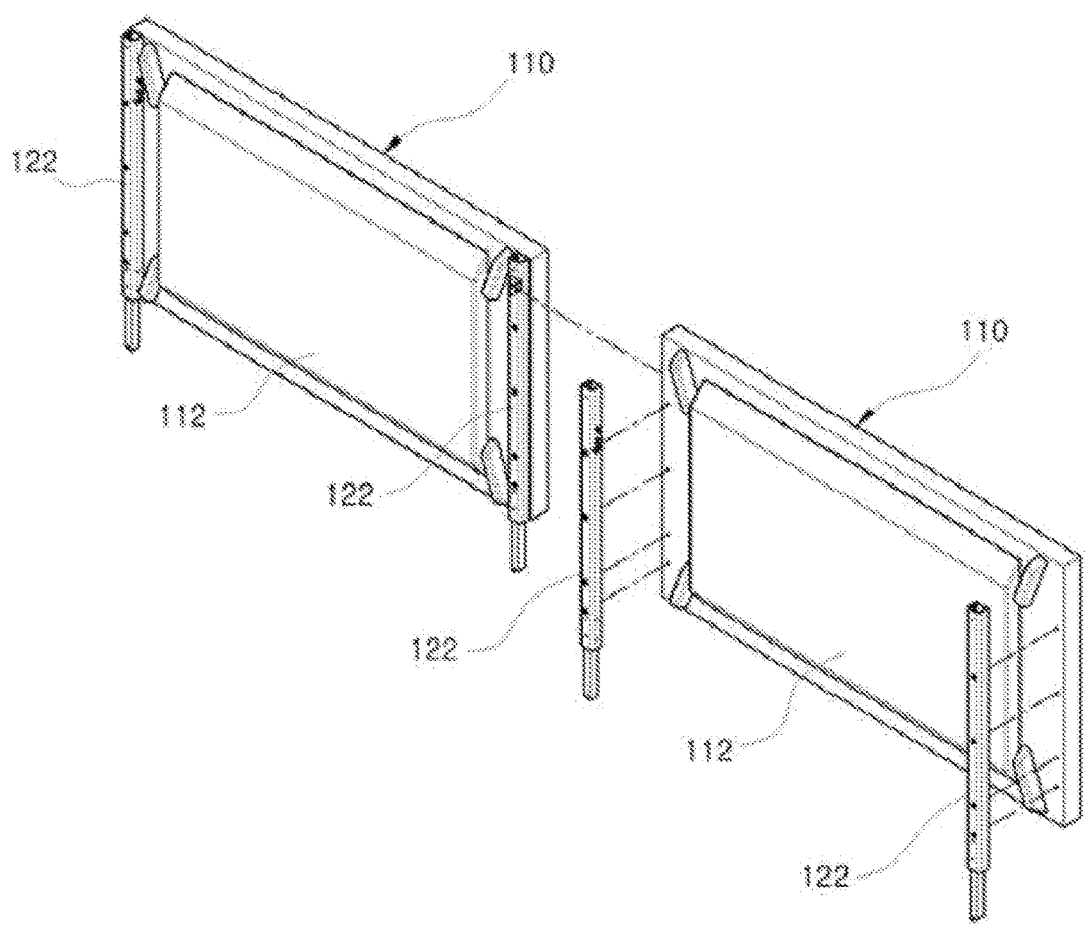
FIG. 3 is an exploded perspective view illustrating a display and a coupling frame coupled with a rear of the display in the multivision display system according to the first exemplary embodiment.

The stand 120 includes a base 121 supported by the horizontal surface, as shown in FIGS. 2 and 3, a plurality of coupling frames 122 fixed to a rear surface of the display 110 and mutually coupled to each other in a vertical direction, and a dummy module 123 installed between the base 121 and the display 110 to allow the display 110 to be installed at a certain height.

The base 121 is formed in an approximate hexagonal shape, which the dummy module 123 is installed on. Casters may be rotatably installed below the base 121 for moving the multivision display system.

The coupling frames 122 each have a bar shape that extends up and down to be long. Two coupling frames 122 are installed on both sides of the rear surface of the display 110 to individually control the heights of both sides of the display 110. Accordingly, the heights of both sides of the display 110 are controlled using the two coupling frames 122, thereby adjusting a level of the display 110. In the present exemplary embodiment, the coupling frames 122 are installed on both sides of the rear surface of the display 110. However, it is understood that one or more other exemplary embodiments are not limited thereto. For example, according to another exemplary embodiment, the coupling frames 122 may be installed on both sides of the display 110.

Figure 4:
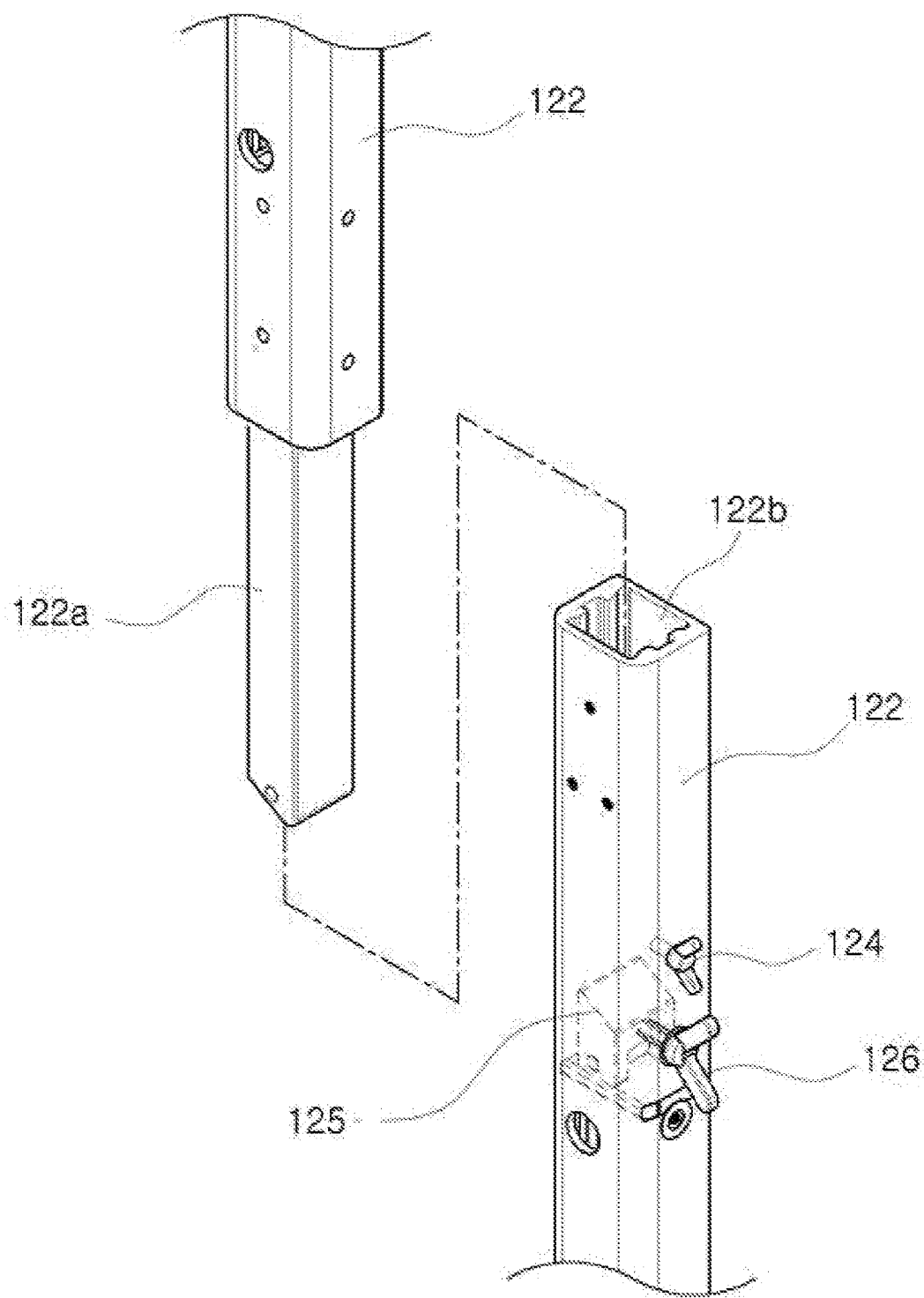
FIG. 4 is an exploded perspective view illustrating top and bottom coupling between coupling frames in the multivision display system according to the first exemplary embodiment.

The coupling frames 122, as shown in FIG. 4, each include a coupling portion 122a that protrudes from a bottom end of the coupling frame 122 and is coupled with the coupling frame 122 located adjacent to the bottom end, and a coupling groove 122b provided on a top end of the coupling frame 122 and into which the coupling portion 122a of the coupling frame 122 located adjacent to a top thereof is inserted. In the present exemplary embodiment, the coupling portion 122a protrudes from the bottom end of the coupling frame 122 and the coupling groove 122b is provided on the top end of the coupling frame 122. However, it is understood that one or more other exemplary embodiments are not limited thereto. For example, according to another exemplary embodiment, a coupling portion 122a may extend from a top end of a coupling frame 122 and a coupling groove 122b may be provided on a bottom end of the coupling frame 122.

The dummy module 123, as shown in FIG. 2, allows the plurality of displays 110 to be installed (e.g., provided) while being separate from the horizontal surface by a certain distance, thereby providing a screen of the multivision display system 10 at the certain distance. The coupling frames 122 are installed on both sides of a rear surface of the dummy module 123, respectively. The dummy module 123 may include various substrates which control an operation of the multivision display system 10.

Figure 5:
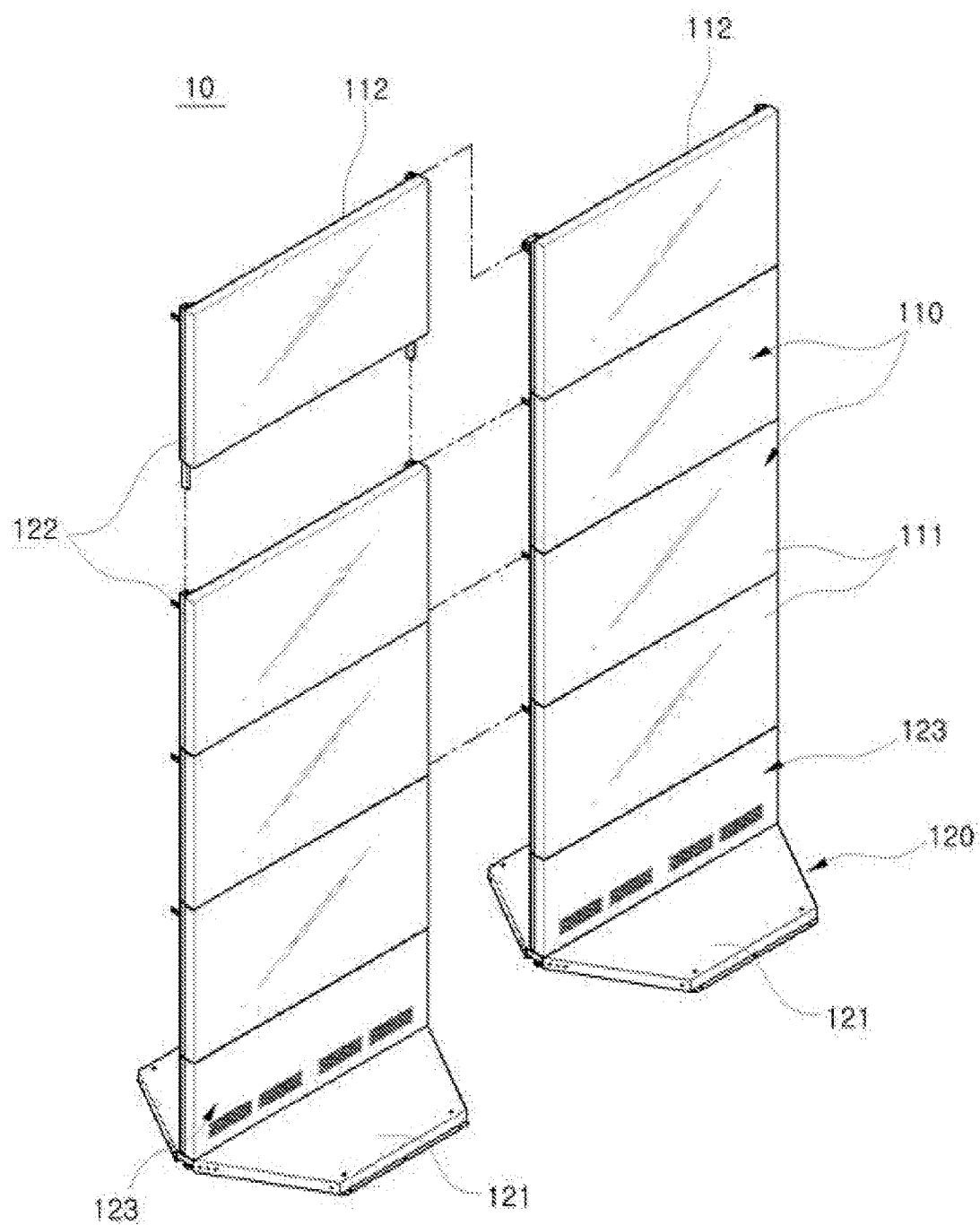
FIG. 5 is an exploded perspective view of the multivision display system according to the first exemplary embodiment.

The plurality of displays 110, as shown in FIG. 5, are installed vertically on the stand 120 using the coupling frames 122 and a plurality of stands 120 on which the plurality of displays 110 are installed, respectively, are disposed horizontally adjacent to each other, thereby disposing the plurality of displays 110 vertically and horizontally adjacent to each other.

In the present exemplary embodiment, four displays 110 are installed on each of two stands 120 that are disposed horizontally adjacent to each other, thereby forming the multivision display system 10 using a total of eight displays 110.

As described above, the plurality of displays 110 installed with the coupling frames 122 on the rear surface may be sequentially stacked on one of the base 121 and the dummy module 123, thereby easily constructing the multivision display system 10 in which the plurality of displays 110 are disposed vertically. Also, the plurality of stands 120 on which the plurality of displays 110 are disposed vertically are disposed left and right, thereby easily constructing the multivision display system 10 in which the plurality of displays 110 are disposed left and right.

In the multivision display system 10 described above, the displays 110 disposed vertically and horizontally may be slightly misaligned from one another due to a tolerance, which causes a phenomenon in which locations of parts of images are misaligned on the entire screen. Thus, it is desirable to reduce a level difference between adjacent displays 110.

Figure 6:
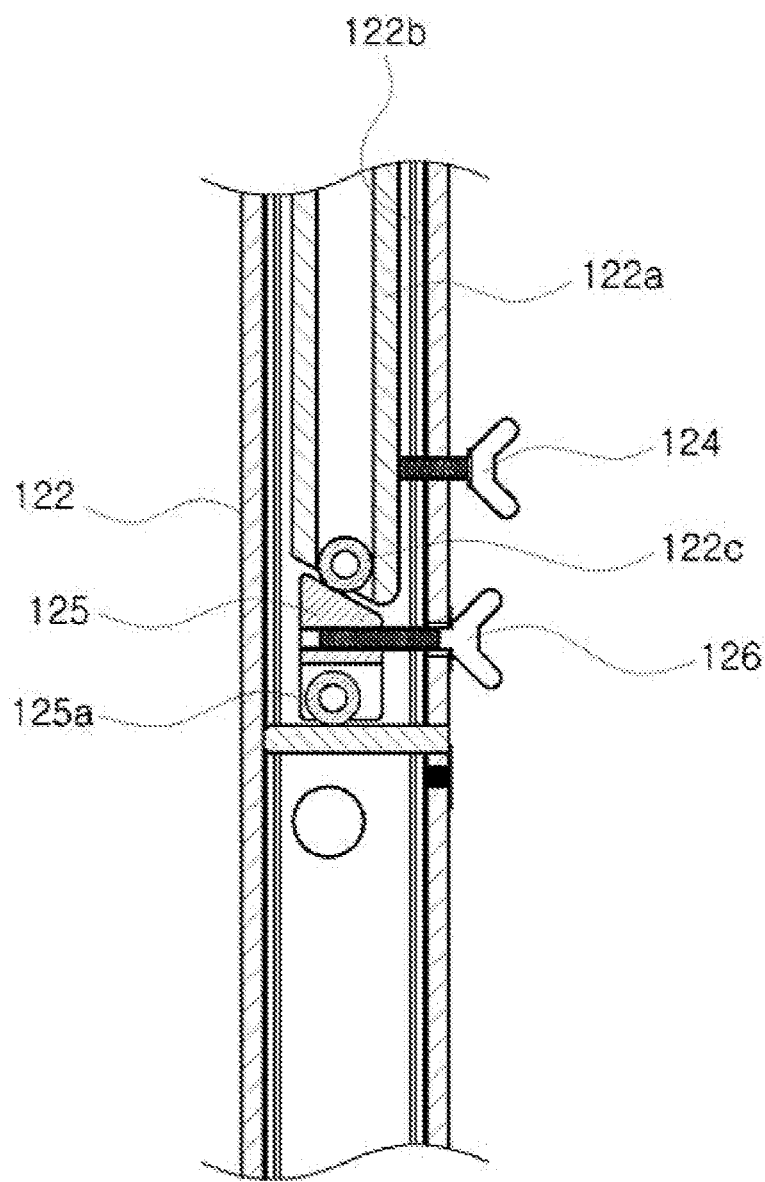
FIGS. 6 to 8 are cross-sectional views illustrating operations for aligning left and right positions of displays disposed vertically in the multivision display system according to the first exemplary embodiment.

Accordingly, the multivision display system 10, as shown in FIG. 6, includes a position adjuster for adjusting the level difference between the adjacent displays 110 which are disposed vertically or horizontally adjacent to each other.

The position adjuster may adjust the level difference between the displays 110 disposed adjacent to each other by adjusting a position of the coupling portion 122a of the adjacent coupling frame 122 coupled with the coupling groove 122b.

To align horizontal positions of the two displays 110 disposed vertically, the coupling groove 122b is formed (e.g., provided) to have a relatively greater width than the coupling portion 122a in such a way that the coupling portion 122a of the adjacent coupling frame 122 coupled with the coupling groove 122b is movable left and right in the coupling groove 122b.

The position adjuster includes a left and right adjusting screw 124 (e.g., horizontal adjusting screw) that is coupled with a top of the coupling frame 122 in such a way that a front end thereof protrudes into the coupling groove 122b and supports the coupling portion 122a coupled with the coupling groove 122b to move the coupling portion 122a left and right.

Figure 7:
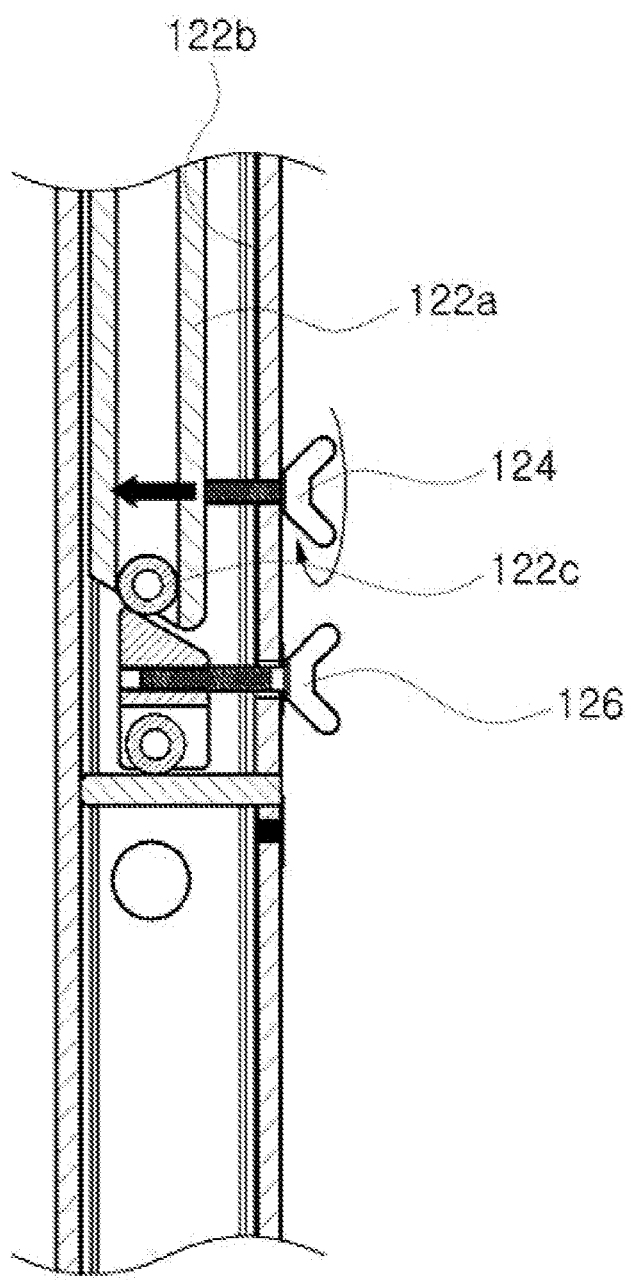
Figure 8:
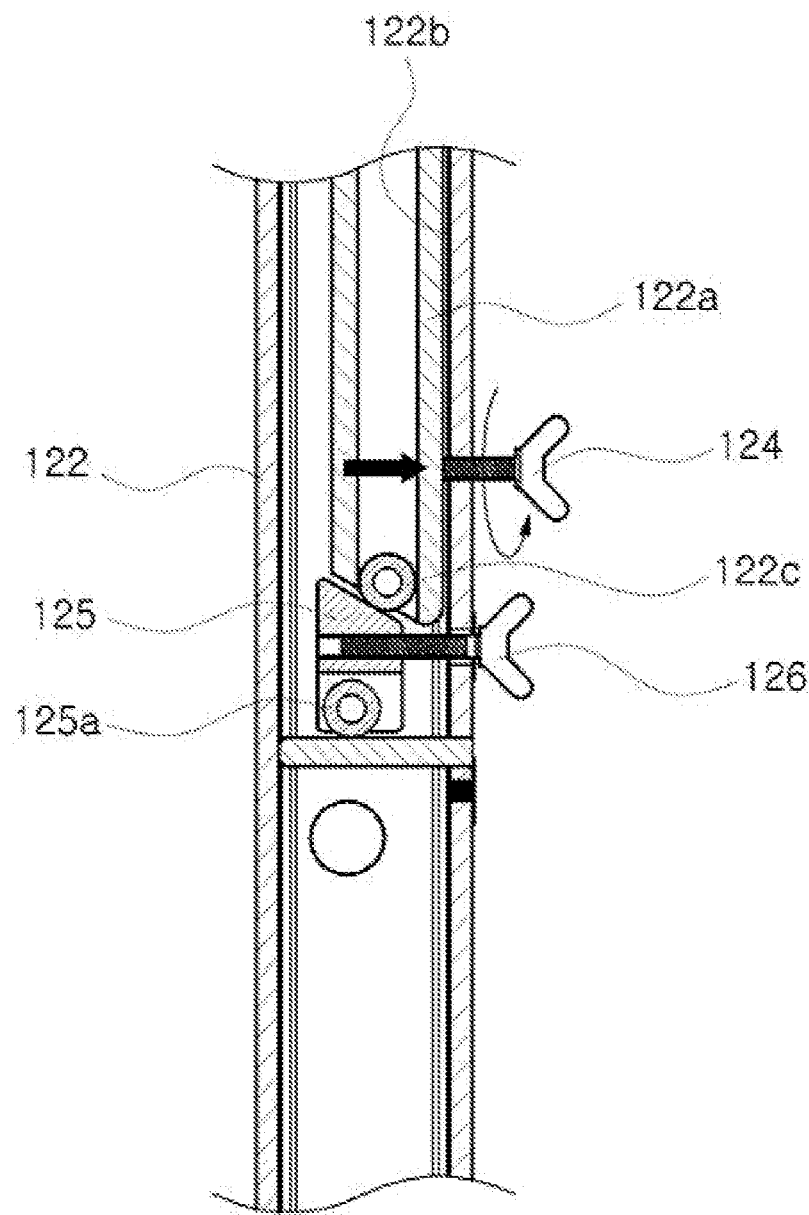

Accordingly, as shown in FIGS. 7 and 8, the left and right adjusting screw 124 is rotated forward and backward in such a way that the coupling portion 122a moves left and right due to the left and right adjusting screw 124. Accordingly, the display 110 located above the left and right adjusting screw 124 moves left and right, thereby aligning left and right positions of the two displays 110 disposed vertically.

Also, to align top and bottom positions of the two adjacent displays 110 disposed left and right, the position adjuster includes an elevating guide 125 disposed inside the coupling groove 122b to allow the coupling portion 122a to move vertically, thereby moving the displays 110.

The elevating guide 125 is installed inside the coupling groove 122b to be movable left and right, and a top surface thereof is formed to be inclined. Also, the coupling portion 122a is formed to allow a bottom surface thereof to be inclined to correspond to the top surface of the elevating guide 125.

The position adjuster includes a top and bottom adjusting screw 126 that is coupled with the top of the coupling frame 122 in such a way that a front end thereof protrudes into the coupling groove 122b and moves the elevating guide 125 disposed inside the coupling groove 122b.

Figure 9:
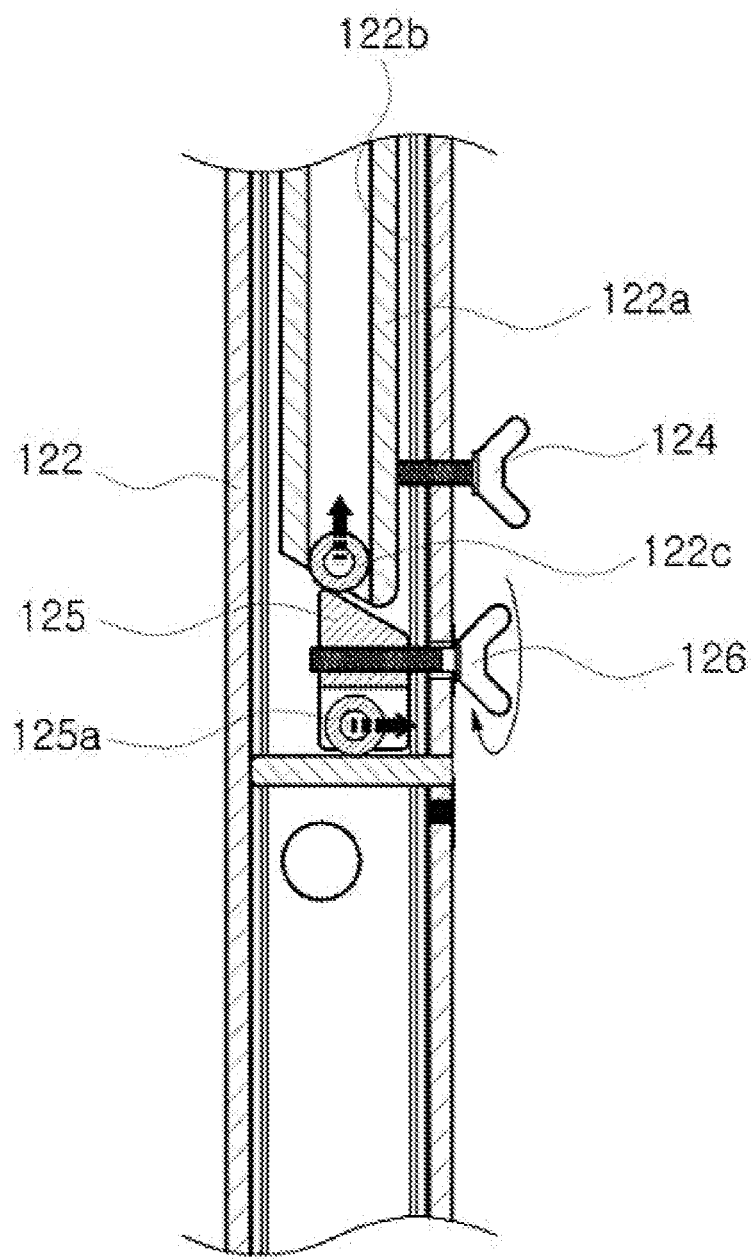
FIGS. 9 to 10 are cross-sectional views illustrating operations for disposing top and bottom positions of displays disposed left and right in the multivision display system according to the first exemplary embodiment.
Figure 10:
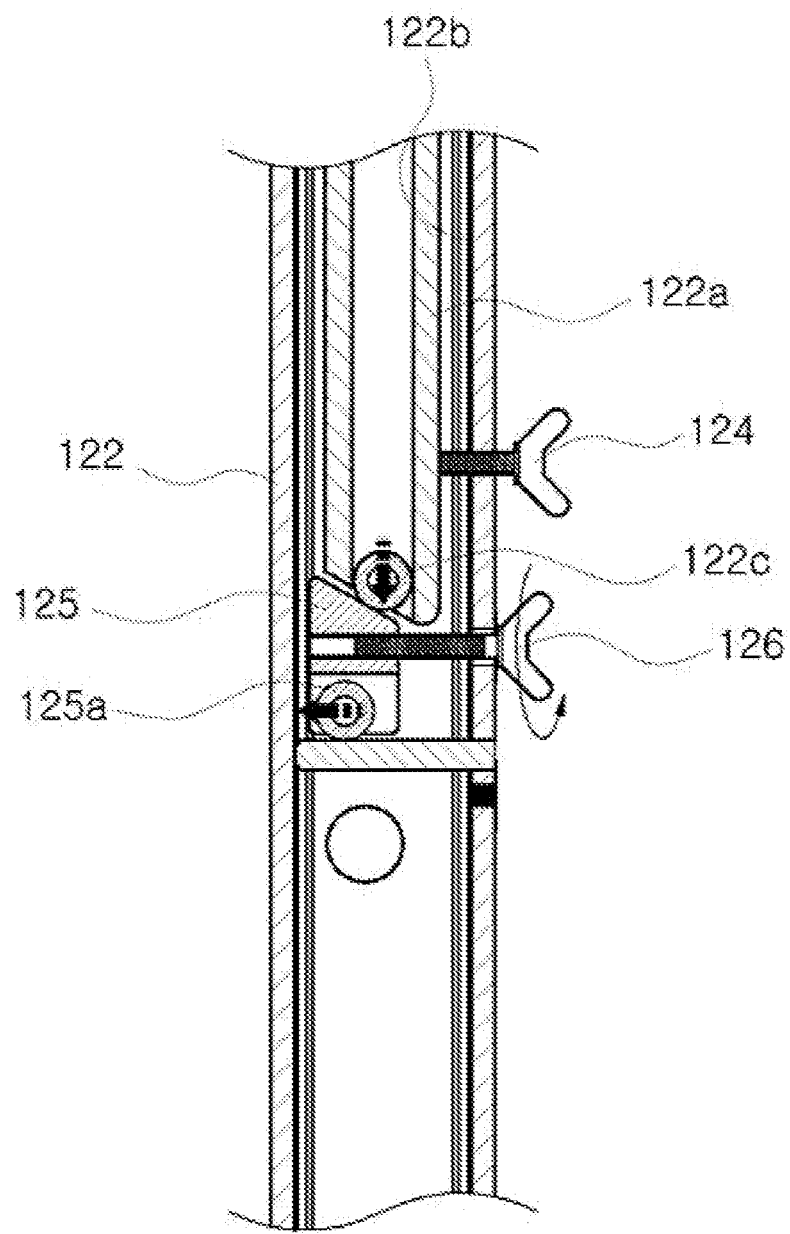

Accordingly, as shown in FIGS. 9 and 10, the elevating guide 125 is moved left and right by rotating the top and bottom adjusting screw 126 forward and backward in such a way that the coupling portion 122a of the coupling frame 122 moves up and down as the elevating guide 125 moves, thereby moving the display 110 installed with the coupling frame 122 up and down. Herein, since the coupling frames 122 are installed on both sides of the rear of the display 110, respectively, the heights of the both sides of the display 110 may be adjusted, respectively.

In the configuration described above, rollers 125a and 122c are rotatably installed on a bottom of the elevating guide 125 and a bottom of the coupling portion 122a, respectively, in such a way that the movement of the elevating guide 125 and the movement of the coupling frame 122 are performed smoothly.

Figure 11:
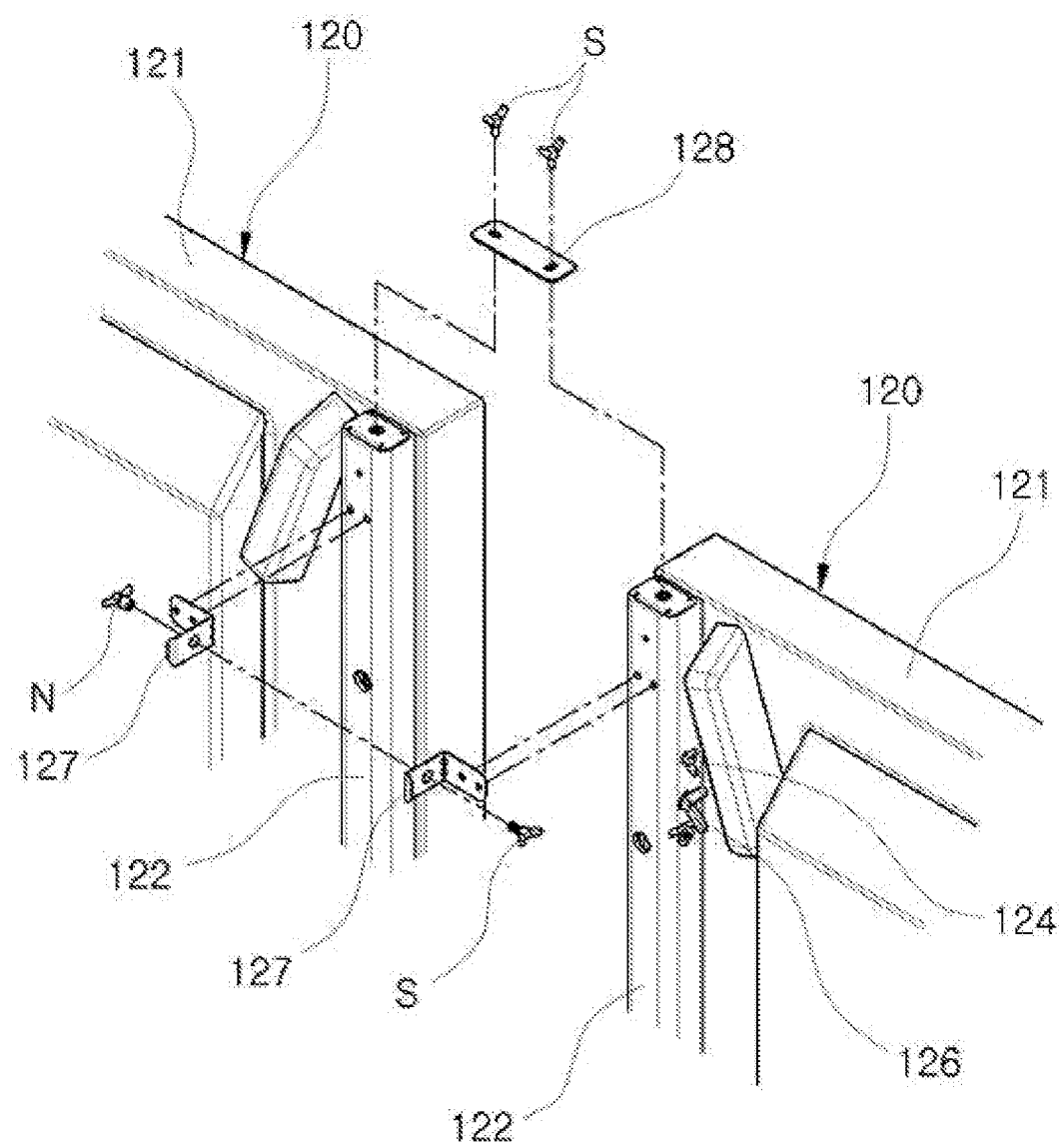
FIG. 11 is an exploded perspective view illustrating the installation of clamps and fixed boards in the multivision display system according to the first exemplary embodiment.

Also, as shown in FIG. 11, to align front and rear positions of the two adjacent displays 110 disposed horizontally to each other, a clamp 127 is installed on the coupling frame 122.

The clamp 127 is installed on each of the two coupling frames 122 installed adjacent to each other, on the rear surfaces of the adjacent displays 110. The clamps 127 are formed in an L shape, are fixed to the two adjacent coupling frames 122, respectively, and are mutually fixed using coupling members S such as screws.

Accordingly, front and rear positions of the two clamps 127 coupled with each other are adjusted to adjust mutual positions of the two adjacent displays 110 and then the two clamps 127 are fixed using the members S, thereby allowing the front and rear positions of the two displays 110 to be aligned.

Also, one fixing plate 128 is fixed to tops of the two coupling frames 122 located uppermost among the coupling frames 122 using the coupling members S to mutually fix the tops of the two coupling frames 122.

Figure 12:
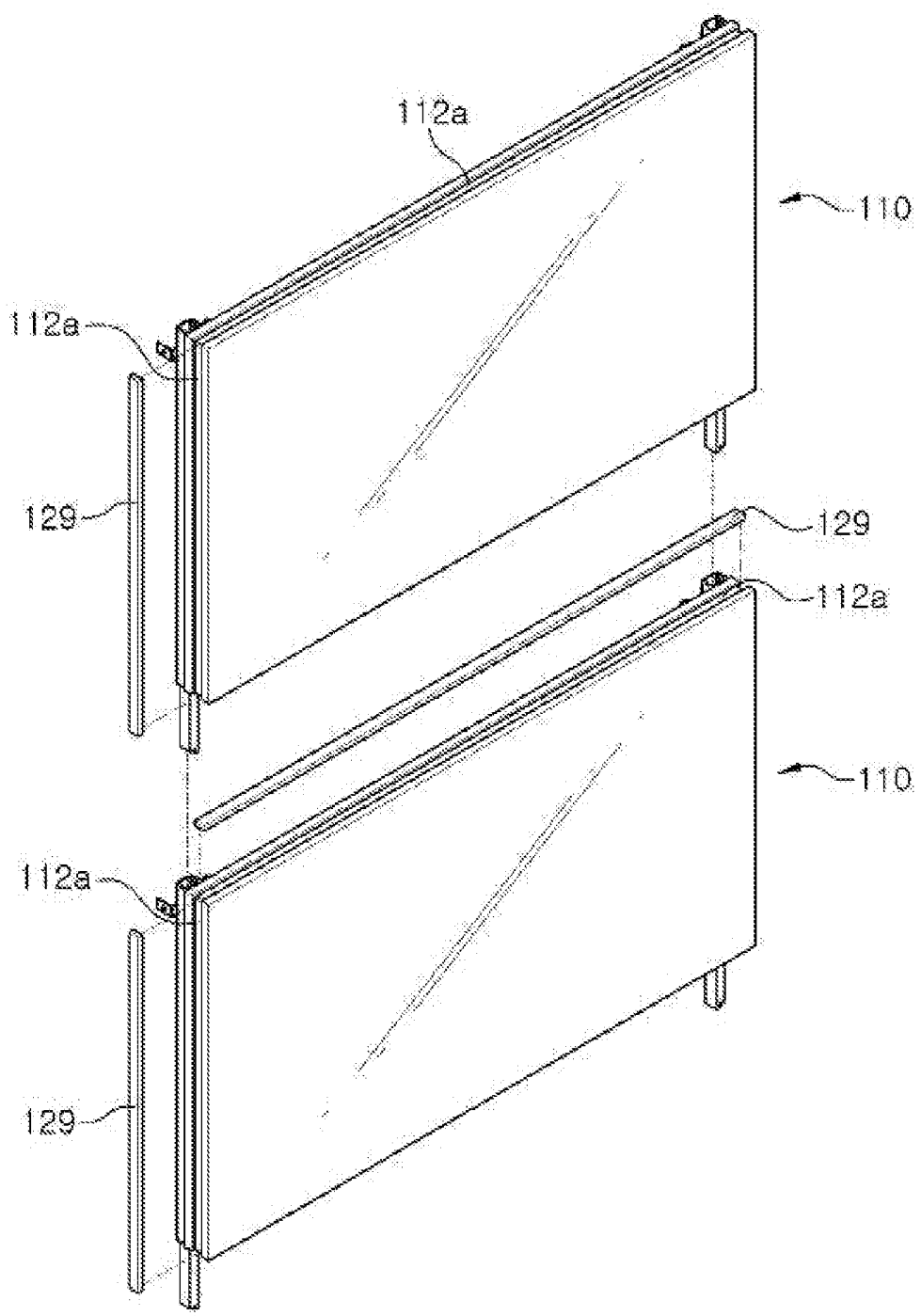
FIG. 12 is an exploded perspective view illustrating an installation state of a spacer in the multivision display system according to the first exemplary embodiment.
Figure 13:
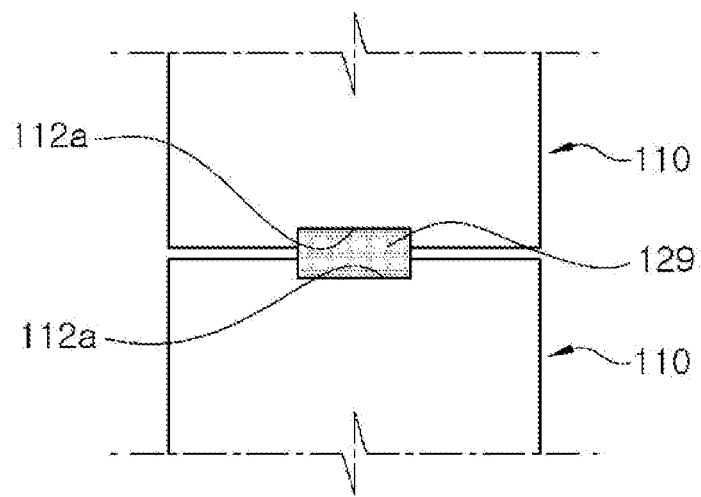
FIG. 13 is a side view illustrating the installation state of the spacer in the multivision display system according to the first exemplary embodiment.

In the multivision display system 10, as shown in FIGS. 12 and 13, spacers 129 are disposed to prevent gaps that may occur inevitably due to tolerances among four side surfaces, provided vertically and horizontally, of the two displays 110 mutually adjacent to each other.

The spacers 129 are formed to have an approximate rectangular cross section while extending to correspond to the side surfaces of the display 110. Also, the spacers 129 are formed of an elastic-deformable material and the four side surfaces, provided vertically and horizontally on the case 112, of the display 110 are concave and provide accommodating grooves 112a that contain a part of the spacer 129, respectively.

Figure 14:
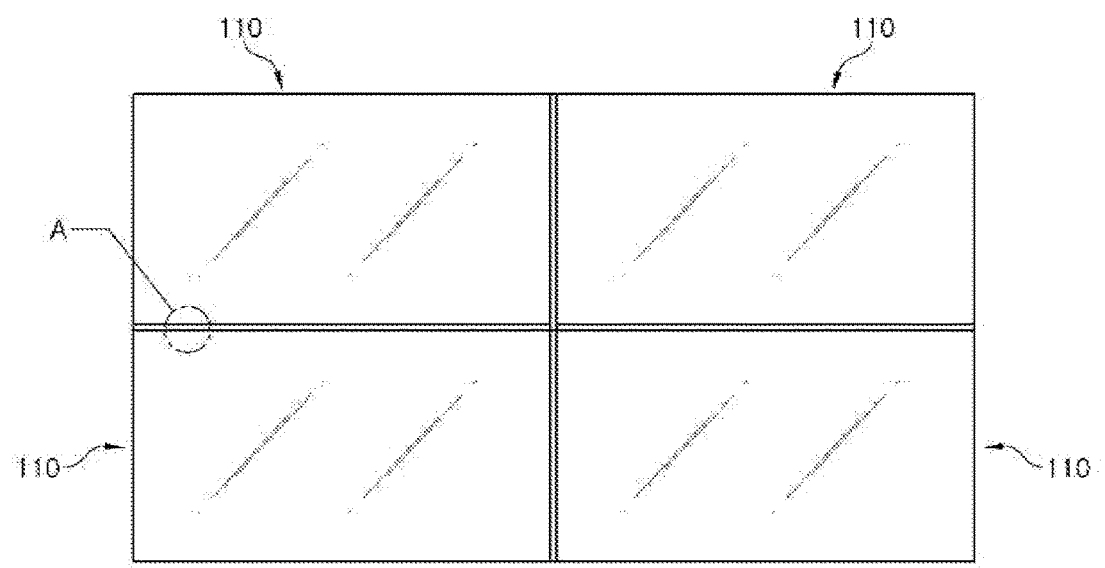
FIG. 14 is a front view illustrating the installation state of the spacer in the multivision display system according to the first exemplary embodiment.
Figure 15:
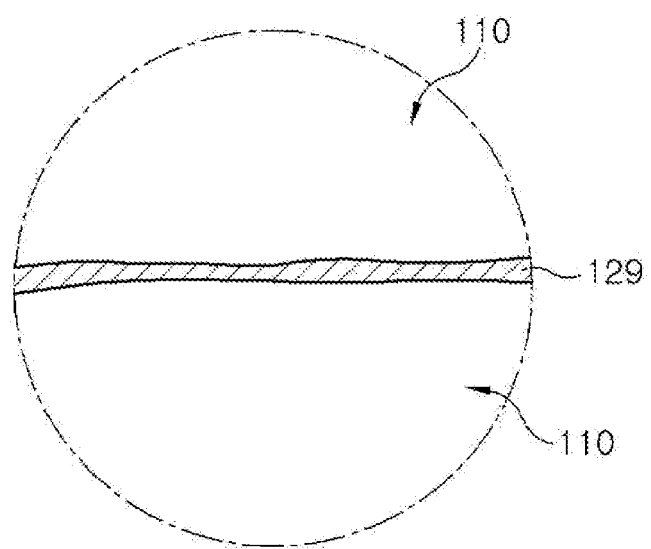
FIG. 15 is an enlarged view illustrating a part "A" shown in FIG. 14.

In the present exemplary embodiment, the accommodating grooves 112a are provided in central portions of the four top, bottom, left, and right surfaces of the display 110 and the spacers 129 are formed to have a relatively greater thickness than a depth of the accommodating groove 112a. Accordingly, when the spacer 129 is installed in the accommodating groove 112a of the display 110, one part of the spacer 129 is accommodated in the accommodating groove 112a and the other part of the spacer 129 protrudes from the outside of the accommodating groove 112a to be accommodated in the accommodating groove 112a provided in the adjacent display 110. Accordingly, as shown in FIGS. 14 and 15, even though a gap is caused by at least one of a tolerance between side surfaces of the displays in contact with each other and an uneven surface, the gap is blocked by the spacer 129. Also, even though a light source exists in the rear of the multivision display system 10, light generated by the light source is prevented from passing through the gap between the side surfaces of the displays 110 and being transferred forward.

Figure 16:
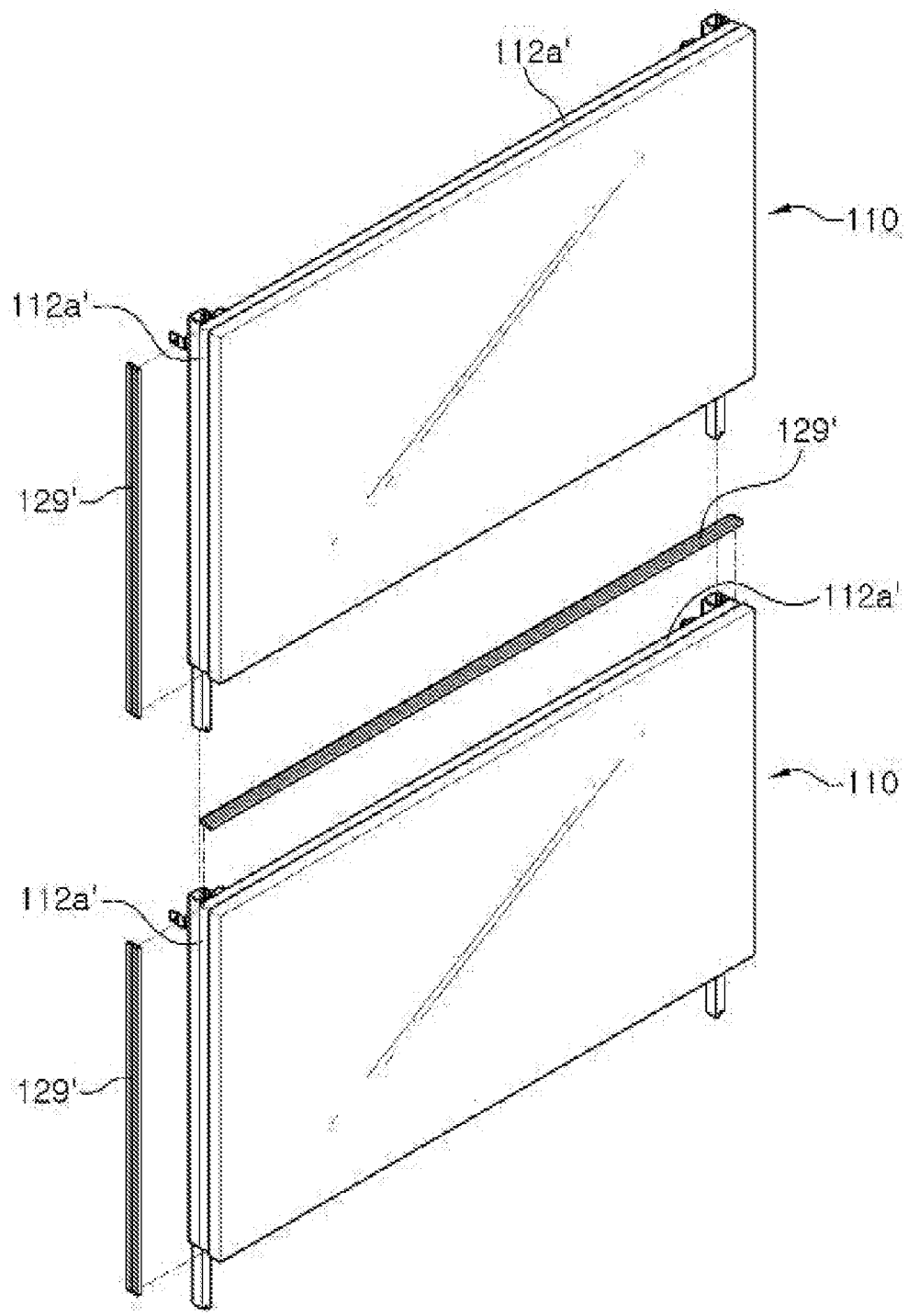
FIG. 16 is an exploded perspective view illustrating an installation state of a spacer in a multivision display system according to a second exemplary embodiment.
Figure 17:
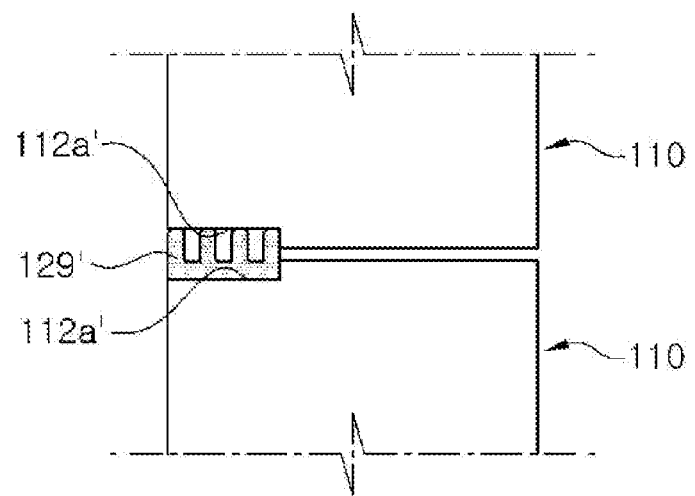
FIG. 17 is a side view illustrating the installation state of the spacer in the multivision display system according to the second exemplary embodiment.

In the present exemplary embodiment, the accommodating groove 112a is provided in the central portions of the side surfaces of the displays 110. However, it is understood that one or more other exemplary embodiments are not limited thereto. As shown in FIGS. 16 and 17, according to a second exemplary embodiment, an accommodating groove 112a' may be formed with a step on a rear end of the side surface of the display 110.

Also, in the second exemplary embodiment, a spacer 129' is formed to have an approximate rectangular cross section, in which a concavo-convex shape is formed on one side of the spacer 129' to allow the spacer 129' to be more easily elastic-deformable while the displays 110 are being installed on the stand 120.

Figure 18:
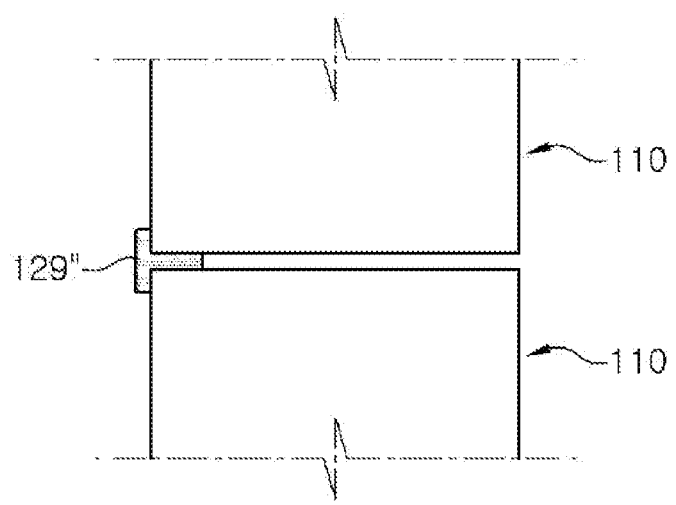
FIG. 18 is a side view illustrating an installation state of a spacer in a multivision display system according to a third exemplary embodiment.

Also, as shown in FIG. 18, according to a third exemplary embodiment, a spacer 129" is formed to have a T-shaped cross section in such a way that portions extending vertically may be supported by the rear surfaces of the two displays 110 and a horizontally protruding portion may be inserted between the side surfaces of the displays 110. Herein, the horizontally protruding portion of the spacer 129" may be inserted between the side surfaces of the two displays 110 or may be attached to the side surface of the display 110. In this case, it is unnecessary to form accommodating grooves in the displays 110 as in the previously-described exemplary embodiments.

In the third exemplary embodiment, the stands 120 each include (or are connected to) one dummy module 123, though it is understood that one or more other exemplary embodiments are not limited thereto. For example, according to another exemplary embodiment, each of the stands 120 may include (or be connected to) a plurality of dummy modules 123. According to another exemplary embodiment, the stand 120 may not have a configuration corresponding to the dummy module 123 and the coupling frames 122 may be directly installed on the base 121.

Also, in the present exemplary embodiment, the multivision display system 10 is formed with the two stands 120 on each of which the four displays 110 are installed, respectively. However, it is understood that one or more other exemplary embodiments are not limited thereto. For example, according to a preferable width and height of the multivision display system 10, various numbers of displays 110 and stands 120 may be used to form the multivision display system 10.

In the present exemplary embodiment, the two coupling frames 122 are coupled with both sides of the rear surface of the display 110, respectively. However, it is understood that one or more other exemplary embodiments are not limited thereto. For example, according to another exemplary embodiment, the coupling frames 122 may be installed on both side surfaces of the display 110.

Also, in the present exemplary embodiment, the two coupling frames 122 are installed on the display 110 to adjust the level of the display 110. However, it is understood that one or more other exemplary embodiments are not limited thereto. For example, according to another exemplary embodiment, only one coupling frame 122 may be installed with each display 110 while the display 110 is rotatably coupled with the coupling frame 122 to adjust the level of the displays 110 by rotating the display 110. Also, top and bottom positions of the displays 110 are adjusted using the coupling frames, thereby mutually aligning heights of the displays disposed horizontally.

In the present exemplary embodiment, the coupling frame 122 is separately provided from the display 110 and installed on the display 110. However, it is understood that one or more other exemplary embodiments are not limited thereto. For example, according to another exemplary embodiment, a coupling portion 122a and a coupling groove 122b may be formed in a case forming an exterior of a display 110 and a position adjuster may be installed therein.

Also, in the present exemplary embodiment, the coupling frame 122 is coupled with the rear surface of the display 110, that is, the outer side thereof. However, it is understood that one or more other exemplary embodiments are not limited thereto. For example, according to another exemplary embodiment, the coupling frame 122 may be coupled while being accommodated in a case forming an exterior of the display 110.

Also, in the present exemplary embodiment, the coupling frame 122 is formed to have a bar shape extending up and down. However, it is understood that one or more other exemplary embodiments are not limited thereto. For example, according to another exemplary embodiment, the coupling frame 122 may be formed to have a bar extending horizontally or may be formed to have various shapes other than the bar shape depending on a design.

Hereinafter, a multivision display system 20 according to the third exemplary embodiment will be described in detail with reference to the drawings.

Figure 19:
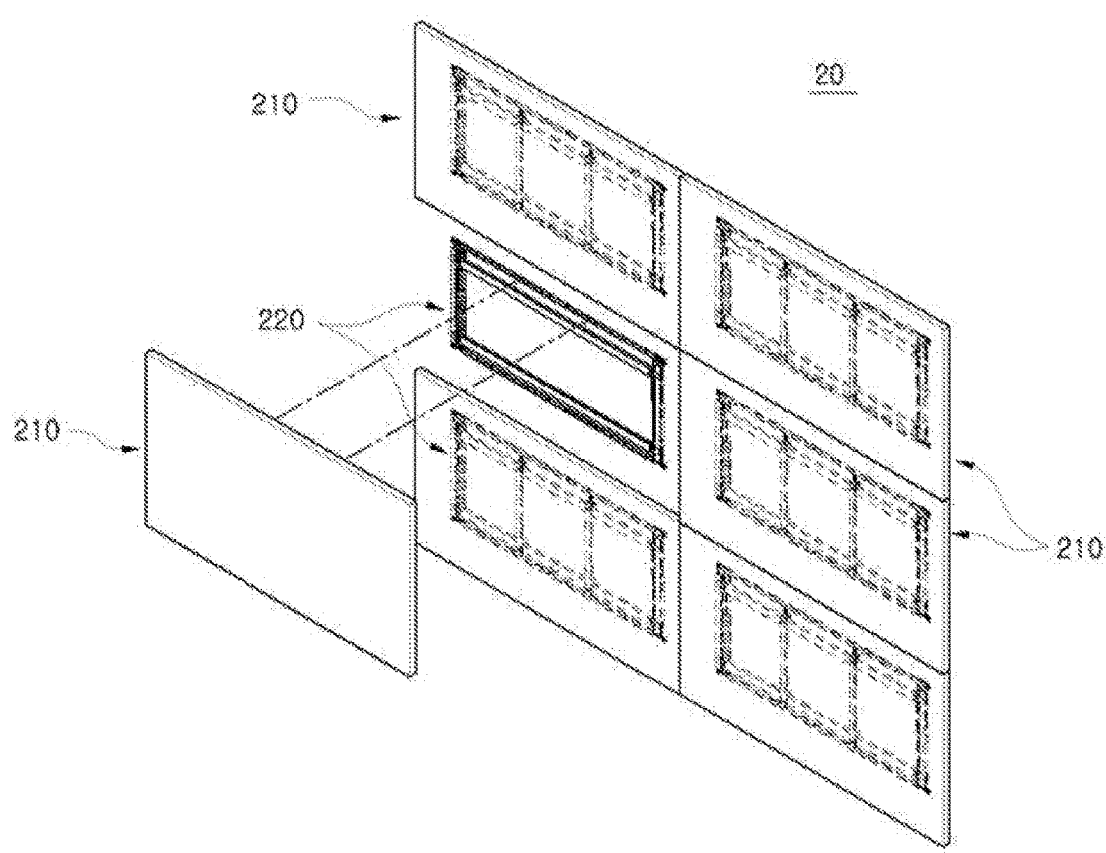
FIG. 19 is a perspective view of a multivision display system according to a fourth exemplary embodiment.
Figure 20:
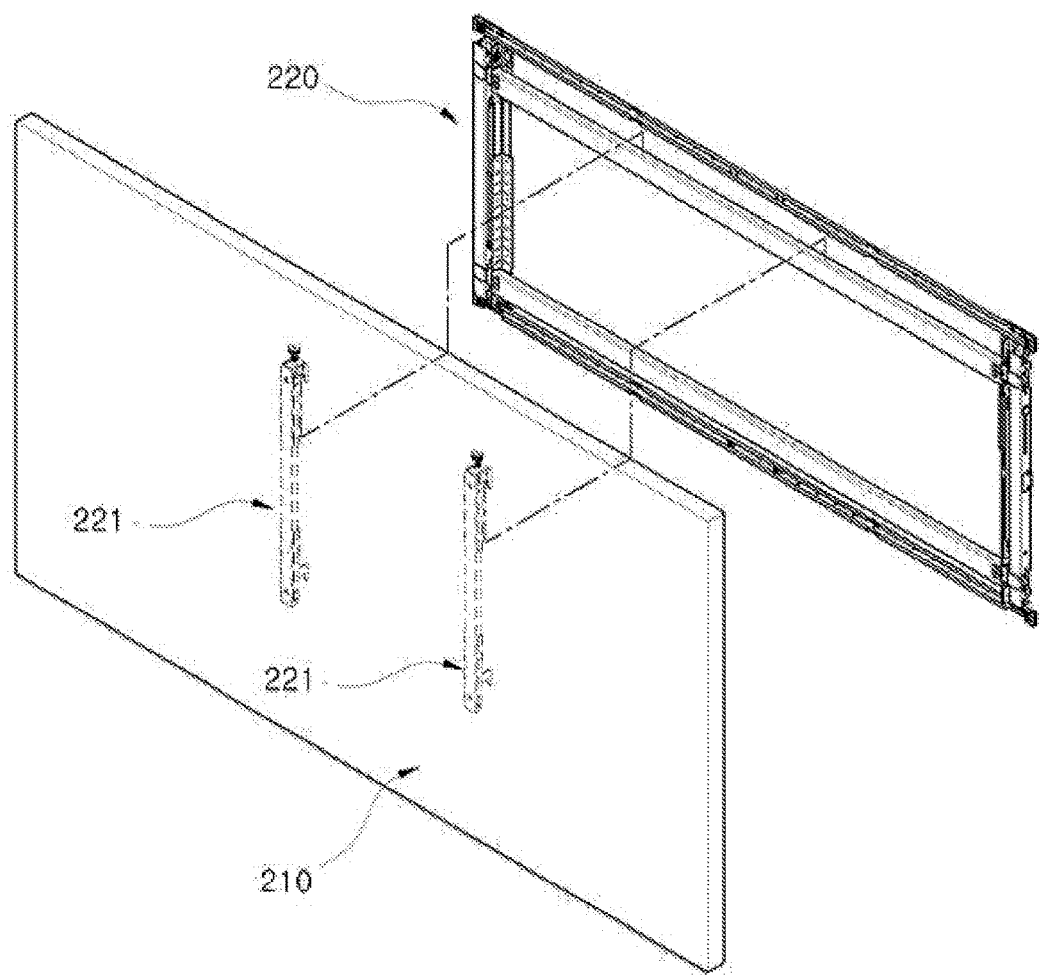
FIG. 20 is an exploded perspective view illustrating a display and wall mounts in the multivision display system according to the fourth exemplary embodiment.

As shown in FIGS. 19 and 20, the multivision display system 20 includes a plurality of displays 210 disposed vertically and horizontally to each other and a plurality of wall mounts 220 that are fixed to the wall vertically and horizontally to each other and support the displays 210, respectively. In the present exemplary embodiment, the multivision display system 20 includes a total of six displays 210 that are disposed vertically in three rows and horizontally in two columns and includes a total of six wall mounts 220 installed on the wall vertically in three rows and horizontally in two columns to correspond to the displays 210.

Figure 21:
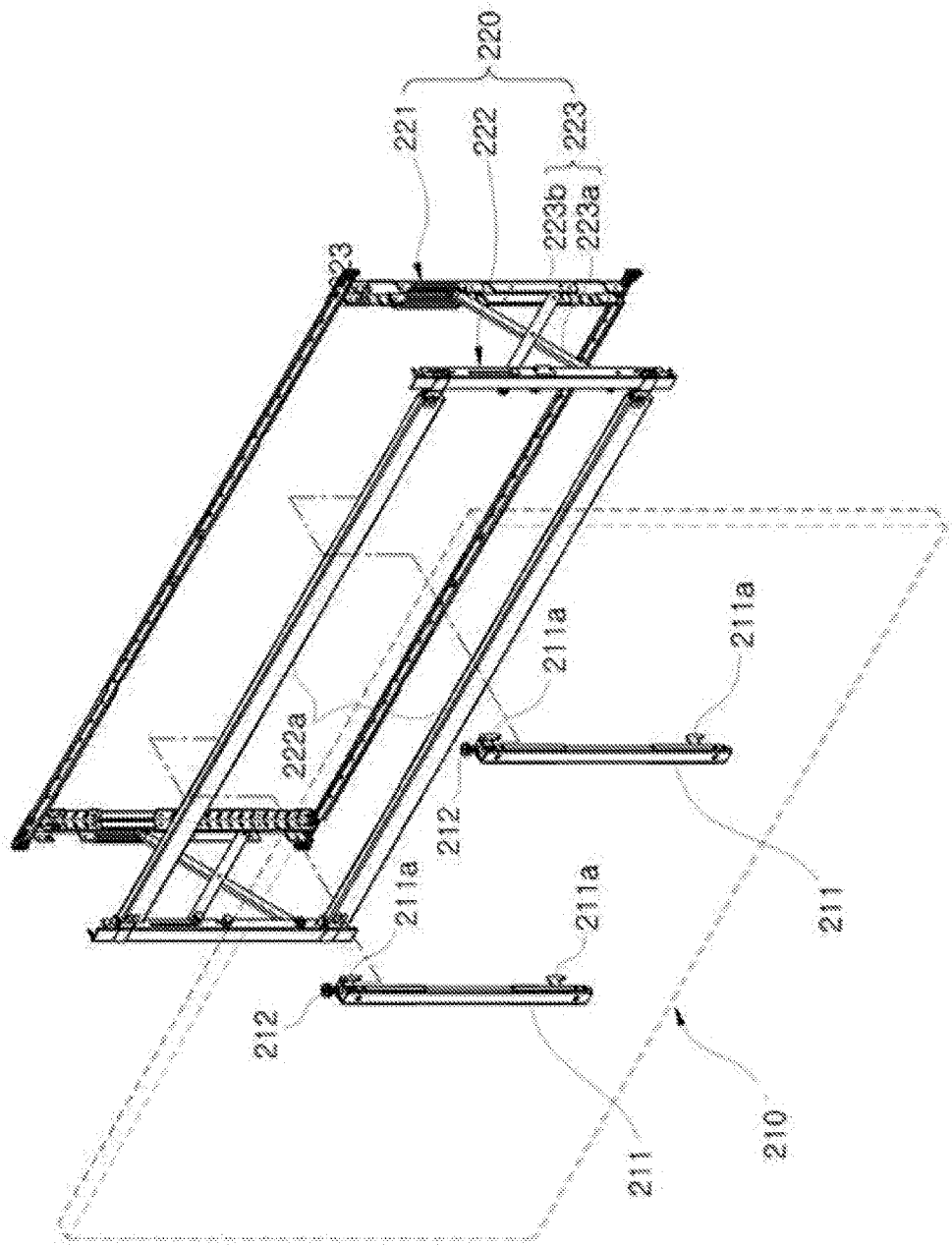
FIG. 21 is a perspective view illustrating engaging members and wall mounts in the multivision display system according to the fourth exemplary embodiment.

The wall mounts 220, as shown in FIG. 21, include a fixed bracket 221 fixed to the wall, a mobile bracket 222 installed to be movable forward and backward with respect to the fixed bracket 221, and a link assembly 223 that allows the mobile bracket 222 to be movably installed on the fixed bracket 221. The display 210 is installed on the mobile bracket 222. Accordingly, the display 210 is installed on the wall using the wall mount 220 to be movable forward and backward.

In the multivision display system 20, to mutually align horizontal positions of the displays 210 disposed vertically, the display 210 is installed on the wall mount 220 to be movable horizontally.

Figure 22:
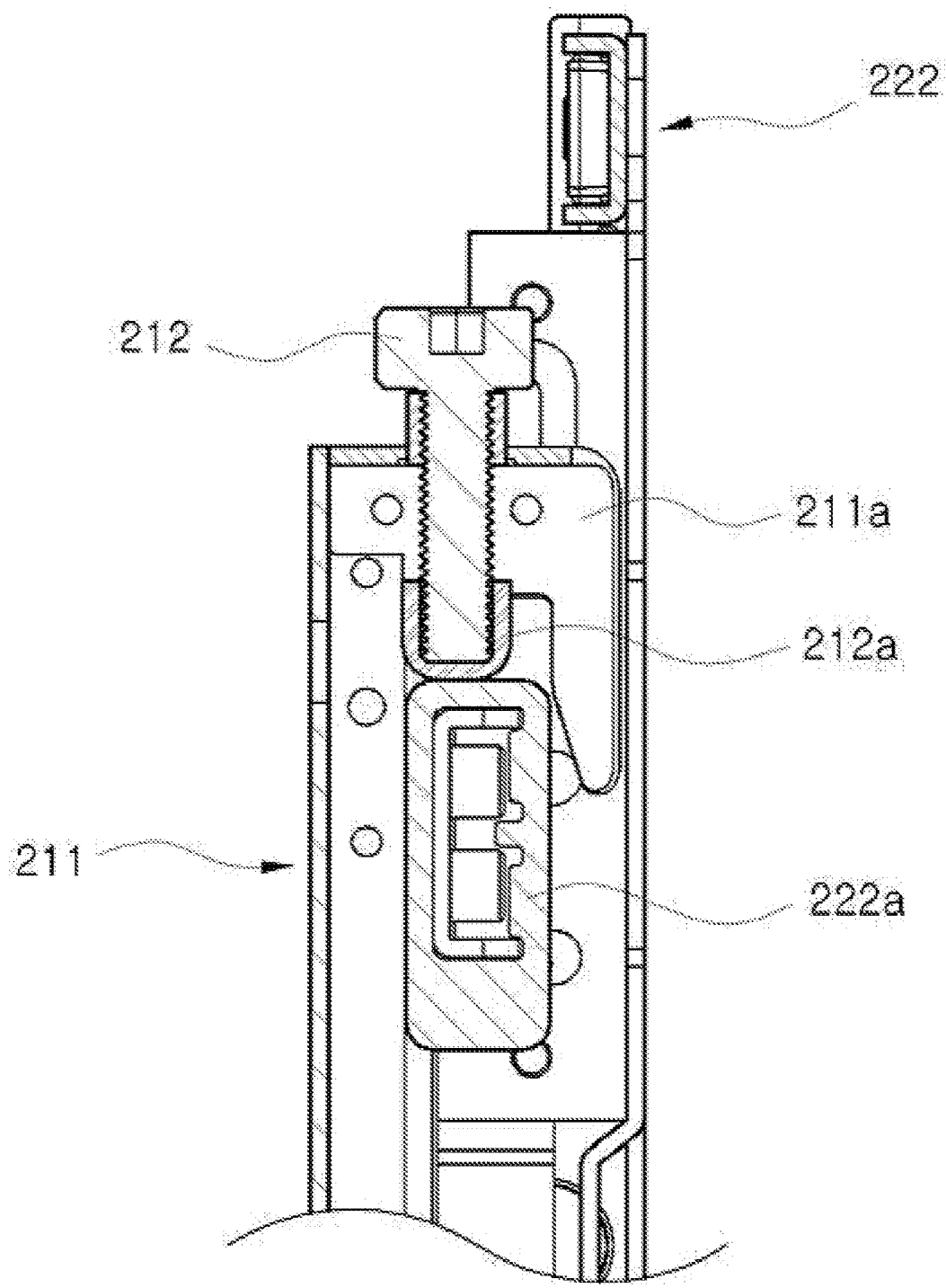
FIG. 22 is a cross-sectional view illustrating an installation state of the engaging member installed on a guide rail of the wall mount in the multivision display system according to the fourth exemplary embodiment.

For this, as shown in FIGS. 21 and 22, a guide rail 222a which extends long left and right is provided on the mobile bracket 222 of the wall mount 220. An engaging member 211 is installed on the rear surface of the display 210 to allow the display 210 to be attached and installed in the guide rail 222a. Two engaging members 211 are installed on both sides of the rear surface of the display 210, and each of the engaging members 211 includes an engaging portion 211a that fits in a top end of the guide rail 222a.

In the present exemplary embodiment, the two guide rails 222a are disposed in a top and bottom of the mobile bracket 222 with a gap. The engaging portions 211a that fit on the two guide rails 222a respectively are provided at a top and bottom of each of the engaging members 211.

Accordingly, the engaging member 211 may move horizontally along the guide rail 222a while fitting on the guide rail 222a using the engaging portion 211a. Thus, a user may move the displays 210 by applying a force to the left and right of the displays 210 to align the left and right positions of the displays 210 disposed vertically.

The engaging portion 211a includes an elevating screw 212 that is rotatably installed on the engaging portions 211a and includes a bottom end passing through the engaging portion 211a and supported by the guide rail 222a. A cap 212a formed of rubber covers the bottom end of the elevating screw 212, and the bottom end of the elevating screw 212 is allowed to be supported by the guide rail 222a via the cap 212a.

Accordingly, as the elevating screw 212 is rotated, the elevating screw 212 moves vertically, thereby moving the display 210 vertically. Therefore, the user may align top and bottom positions of the displays 210 disposed horizontally adjacent to each other while rotating the elevating screw 212.

Figure 23:
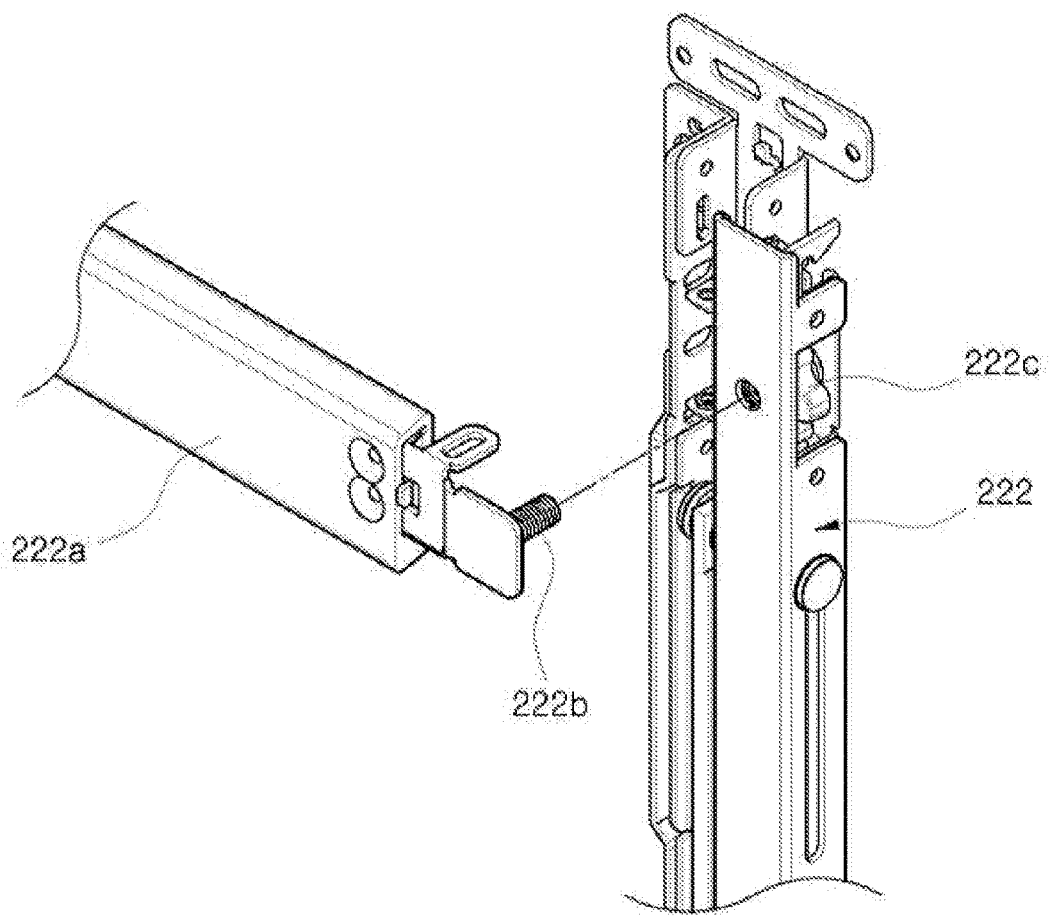
FIG. 23 is an exploded perspective view illustrating an installation state of the guide rail in the multivision display system according to the fourth exemplary embodiment.
Figure 24:
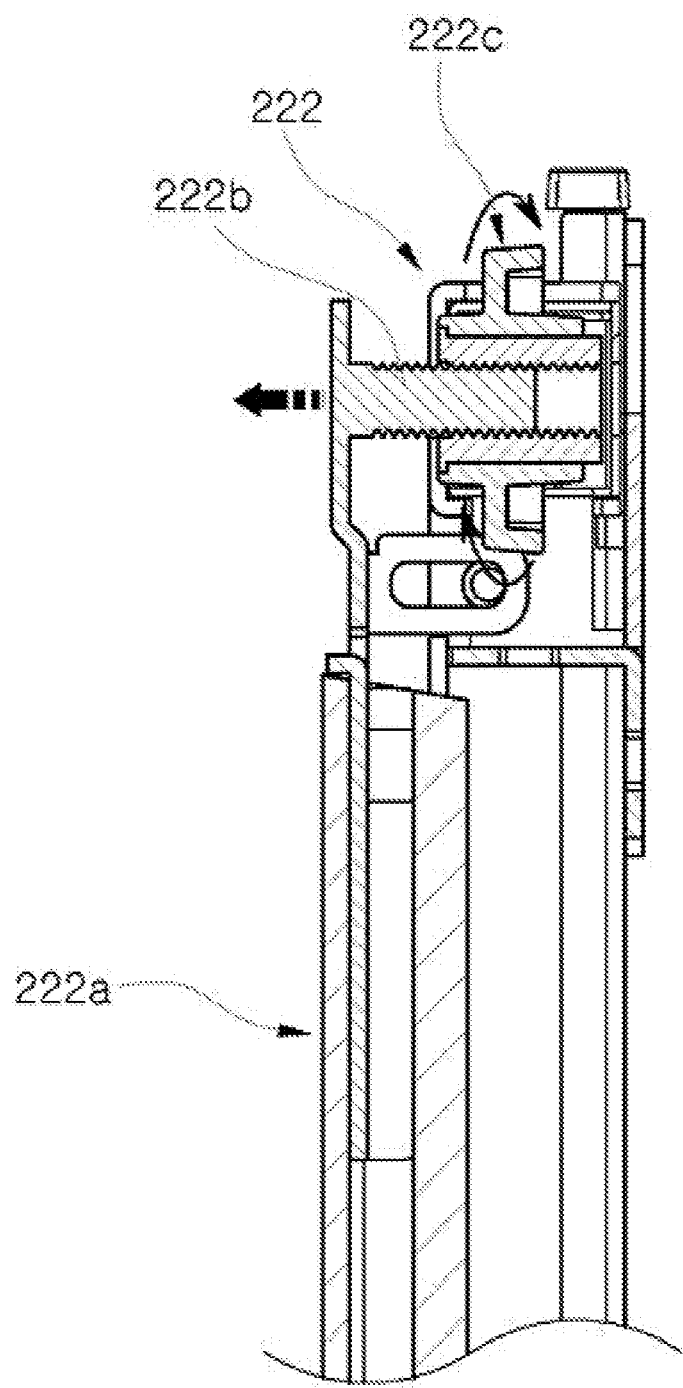
FIGS. 24 and 25 are cross-sectional views illustrating an operation of the guide rail in the multivision display system according to the fourth exemplary embodiment.

Also, the guide rail 222a is installed on the mobile bracket 222 to be movable forward and backward to adjust a position of the display 210 forward and backward. To allow the guide rail 222a to move forward and backward, as shown in FIGS. 23 and 24, a forward and backward adjusting screw 222b is installed on each of both sides of the guide rail 222a and a forward and backward adjusting nut 222c rotatably installed in the mobile bracket 222 and screw-coupled with the forward and backward adjusting screw 222b is disposed in the mobile bracket 222.

Figure 25:
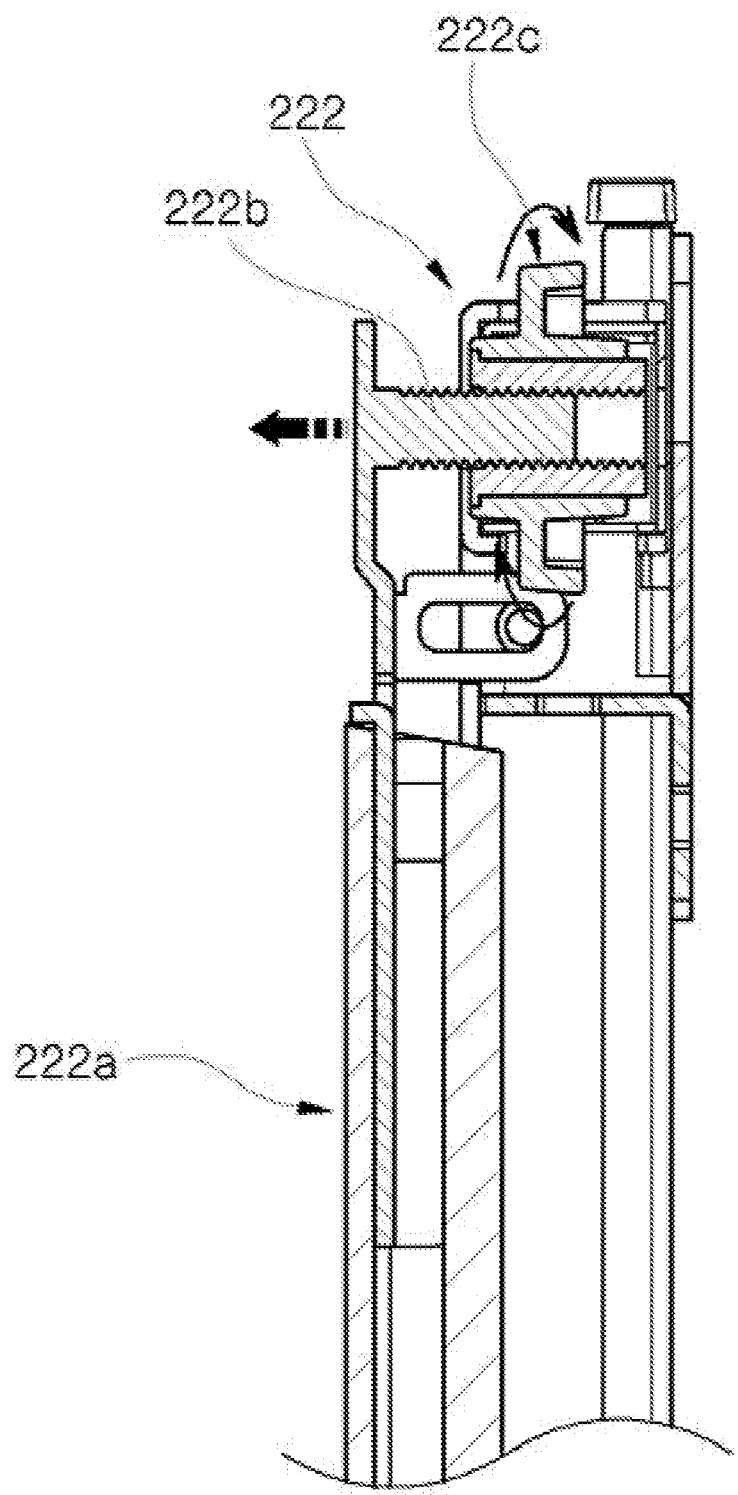

Accordingly, when rotating the forward and backward adjusting nut 222c coupled with the forward and backward adjusting screw 222b, as shown in FIG. 25, the forward and backward adjusting screw 222b moves forward and backward and the guide rail 222a moves forward and backward together with the forward and backward adjusting screw 222b. Since the display 210 is installed while being attached in the guide rail 222a using the engaging member 211, the display 210 moves forward and backward together with the guide rail 222a.

Therefore, the user may mutually align front and rear positions of the displays 210 disposed vertically to each other by rotating the forward and backward adjusting nut 222c forward and backward.

The link assembly 223, as shown in FIG. 21, includes a first link 223a with one end rotatably installed on the fixed bracket 221 and another end installed on the mobile bracket 222 to be rotatable and movable vertically, and a second link 223b with one end rotatably installed on the mobile bracket 222 and another end installed on the fixed bracket 221 to be rotatable and movable vertically. The first link 223a and the second link 223b are installed to allow central portions thereof to be rotatable.

Accordingly, since the displays 210 move horizontally using the guide rail 222a, move vertically using the elevating screw 212, and move forward and backward using the forward and backward adjusting screw 222b and the forward and backward adjusting nut 222c, relative positions of the displays 210 may be adjusted to be precisely aligned.

Figure 26:
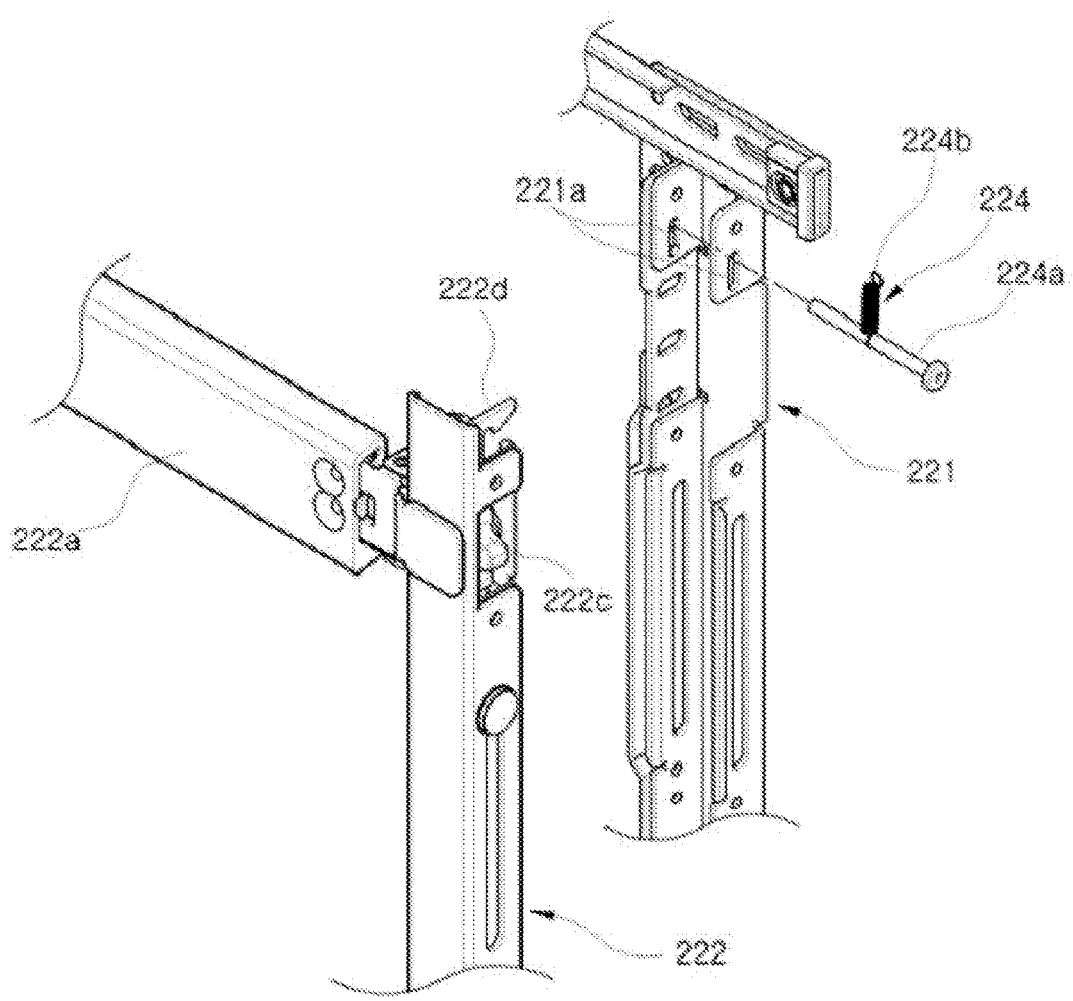
FIG. 26 is a perspective view illustrating a locking member in the multivision display system according to the fourth exemplary embodiment.

Also, the wall mount 220, as shown in FIG. 26, includes a locking device 224 for restricting the movement of the mobile bracket 222. In the present exemplary embodiment, the locking device 224 includes a locking member 224a installed in guide slots 221a provided on the fixed bracket 221 to be movable vertically, an elastic member 224b that elastically supports the locking member 224a upward, and a locking portion 222d that is provided on the mobile bracket 222 and fits on the locking member 224a to lock the locking member 224a. In the present exemplary embodiment, locking devices 224 are provided on upper portions and lower portions of both sides of the wall mount 220, respectively.

In the present exemplary embodiment, to easily install the display 210, the wall mount 220 includes the fixed bracket 221, the mobile bracket 222, and the link assembly 223 to move the display 210 forward and backward. However, it is understood that one or more other exemplary embodiments are not limited thereto. For example, according to another exemplary embodiment, the wall mount 220 may include only the fixed bracket 221, and the guide rail 222a may be installed on the fixed bracket 221.

As described above, displays may be installed vertically adjacent by coupling frames installed on rear surfaces of displays with one another and may be disposed horizontally adjacent by disposing stands horizontally, on which the displays are installed, thereby easily installing a multivision display system.

Also, since displays may be moved vertically, horizontally, and forward and backward, top, bottom, left, right, front, and rear positions of the displays may be easily aligned with one another.

Although a few exemplary embodiments have been shown and described above, it would be appreciated by those skilled in the art that changes may be made in these exemplary embodiments without departing from the principles and spirit of the invention, the scope of which is defined in the claims and their equivalents.

What is claimed is:

1. A multivision display system comprising:
    a plurality of displays; and
    at least one stand configured to support the plurality of displays so as to stand on a horizontal surface,
    wherein the stand comprises: a base configured to be supported by the horizontal surface; and
    a plurality of coupling frames configured to support the plurality of displays along both sides of the displays in a vertical direction and which are mutually coupled to each other to adjust at least relative horizontal positions of the plurality of displays; and the plurality of coupling frames each comprises:
    a coupling portion is formed with a roller on an inclined surface and extending from one end of the coupling frame; a coupling groove provided on another end of the coupling frame, and an elevating guide comprises an inclined surface; when the elevating guide moves inside the coupling groove in a horizontal direction the roller moves on the inclined surface of the elevating guide and adjust the horizontal positions of coupling portion.

2. The system of claim 1, wherein the plurality of coupling frames each have a bar shape and are respectively coupled with a rear surface of each of the plurality of displays.

3. The system of claim 1, further comprising:
    a pair of clamps on two adjacent coupling frames, among the plurality of coupling frames, that are on two adjacent displays, among the plurality of displays; and
    a coupling member configured to fix the pair of clamps to each other.

4. The system of claim 1, further comprising a spacer disposed between side surfaces of two adjacent displays, among the plurality of displays, to block a gap formed between outer surfaces of the two adjacent displays.

5. The system of claim 4, wherein the plurality of displays each comprise an accommodating groove provided concavely on a side surface thereof and configured to accommodate at least a part of the spacer.

6. The system of claim 4, wherein the spacer comprises an elastic-deformable material and is thicker than a depth of the accommodating groove.

* * * * *